(12) United States Patent
Shino

(10) Patent No.: US 11,108,706 B2
(45) Date of Patent: Aug. 31, 2021

(54) DATA TRANSFER CIRCUIT, DATA TRANSFER SYSTEM, AND METHOD FOR CONTROLLING DATA TRANSFER CIRCUIT

(71) Applicant: Sony Corporation, Tokyo (JP)

(72) Inventor: Toshiaki Shino, Tokyo (JP)

(73) Assignee: Sony Corporation, Tokyo (JP)

( * ) Notice: Subject to any disclaimer, the term of this patent is extended or adjusted under 35 U.S.C. 154(b) by 384 days.

(21) Appl. No.: 16/099,519

(22) PCT Filed: Mar. 31, 2017

(86) PCT No.: PCT/JP2017/013517
§ 371 (c)(1),
(2) Date: Nov. 7, 2018

(87) PCT Pub. No.: WO2017/199596
PCT Pub. Date: Nov. 23, 2017

(65) Prior Publication Data
US 2019/0149485 A1    May 16, 2019

(30) Foreign Application Priority Data

May 19, 2016  (JP) .............................. JP2016-100590

(51) Int. Cl.
*H04L 12/861* (2013.01)
*G06F 13/38* (2006.01)
(Continued)

(52) U.S. Cl.
CPC ................ *H04L 49/90* (2013.01); *G06F 3/00* (2013.01); *G06F 3/14* (2013.01); *G06F 3/147* (2013.01);
(Continued)

(58) Field of Classification Search
None
See application file for complete search history.

(56) References Cited

U.S. PATENT DOCUMENTS

2005/0001799 A1*  1/2005  Kim .................... G09G 3/3688
                                                                    345/87
2005/0104826 A1*  5/2005  Baek ................... G09G 3/3648
                                                                    345/87
(Continued)

FOREIGN PATENT DOCUMENTS

JP        2014-524613 A     9/2014
WO       2007/043644 A1    4/2007

*Primary Examiner* — Christopher M Crutchfield
(74) *Attorney, Agent, or Firm* — Michael Best & Friedrich LLP

(57) ABSTRACT

The number of wiring lines is reduced in a system that transfers data between different power domains.

A transmission side buffer starts, at a start timing, processing of sequentially selecting a plurality of transmission side buffer areas and holding transmission data in the areas selected over a predetermined time. A voltage conversion unit performs voltage conversion on the transmission data held and outputs the transmission data as received data. A reception side buffer starts, when a delay time less than the predetermined time has elapsed from the start timing, processing of sequentially selecting a plurality of reception side buffer areas and holding the received data in the areas selected over the predetermined time.

17 Claims, 23 Drawing Sheets

(51) Int. Cl.
*H04L 25/03* (2006.01)
*G06F 3/00* (2006.01)
*H01L 27/00* (2006.01)
*G06F 3/147* (2006.01)
*G06F 3/14* (2006.01)
*H03K 3/037* (2006.01)
*H03K 19/0175* (2006.01)

(52) U.S. Cl.
CPC .............. *G06F 13/38* (2013.01); *H01L 27/00* (2013.01); *H03K 3/037* (2013.01); *H03K 19/017509* (2013.01); *H04L 25/03* (2013.01)

(56) References Cited

U.S. PATENT DOCUMENTS

| | | | |
|---|---|---|---|
| 2006/0232520 A1* | 10/2006 | Park | G09G 3/3291 345/76 |
| 2008/0002762 A1* | 1/2008 | Cranford | H04L 1/24 375/226 |
| 2010/0229039 A1* | 9/2010 | Chikada | G11C 29/56 714/27 |
| 2011/0032019 A1* | 2/2011 | Saether | H03K 19/018521 327/333 |
| 2013/0076424 A1* | 3/2013 | Mohammad | G06F 13/4072 327/263 |
| 2014/0015823 A1* | 1/2014 | Suh | G09G 3/20 345/212 |
| 2014/0164854 A1* | 6/2014 | Damodaran | G11C 29/12005 714/718 |

* cited by examiner

FIG. 5

| ENABLE SIGNAL ENt | CLOCK SIGNAL CLKt | OPERATION OF ONE-HOT STATE COUNTER |
|---|---|---|
| 0 | — | INITIALIZATION OF STATEt |
| 1 | OTHER THAN RISING EDGE | HOLD OF STATEt |
| 1 | RISING EDGE | UPDATE OF STATEt |

FIG. 6

| BIT bn IN STATE | CLOCK SIGNAL CLKt | OPERATION OF REGISTER |
|---|---|---|
| 0 | — | HOLD OF DATA |
| 1 | OTHER THAN RISING EDGE | HOLD OF DATA |
| 1 | RISING EDGE | UPDATE OF DATA | a b

DATA TRANSFER CIRCUIT, DATA TRANSFER SYSTEM, AND METHOD FOR CONTROLLING DATA TRANSFER CIRCUIT

TECHNICAL FIELD

The present technology relates to a data transfer circuit, a data transfer system, and a method for controlling a data transfer circuit. Specifically, the present technology relates to a data transfer circuit arranged between power domains different from each other, a data transfer system including a plurality of the data transfer circuits, and a method for controlling the data transfer circuits.

BACKGROUND ART

Conventionally, a circuit such as a large scale integration (LSI) is often divided into a plurality of areas (hereinafter referred to as "power domains") having power supply voltages different from each other and managed to efficiently use electric power. When data is transmitted and received mutually between these power domains, a level shifter is provided for performing voltage conversion between the power domains. In addition, since a delay occurs due to the level shifter, buffers are provided before and after the level shifter to reduce influence of the delay. For example, a device has been devised in which a buffer including a plurality of registers is provided together with a selector and a level shifter (see, for example, Patent Document 1).

CITATION LIST

Patent Document

Patent Document 1: Japanese Patent Application Laid-Open No. 2014-524613

SUMMARY OF THE INVENTION

Problems to be Solved by the Invention

In the conventional technology described above, the buffer holds data from the transmission side in a plurality of registers in order of arrival. The level shifter is provided for each register, converts a voltage of the data held in the corresponding register, and outputs the data converted to the selector. The selector sequentially selects the data from the level shifter and outputs the data to the reception side. However, in the conventional technology described above, there is a problem that the number of wiring lines between the buffer and the selector increases as the number of registers in the buffer increases. Since the number and cost of the level shifters may increase as the number of wiring lines increases, the smaller number of wiring lines is more desirable.

The present technology has been created in view of such a situation, and aims to reduce the number of wiring lines in a system that transfers data between different power domains.

Solutions to Problems

The present technology has been made to solve the problem described above, and a first aspect of the present technology is a data transfer circuit and a method for controlling the data transfer circuit, the data transfer circuit including: a transmission side buffer that starts, at a start timing, processing of sequentially selecting a plurality of transmission side buffer areas and holding transmission data in the areas selected over a predetermined time; a voltage conversion unit that performs voltage conversion on the transmission data held and outputs the transmission data as received data; and a reception side buffer that starts, when a delay time less than the predetermined time has elapsed from the start timing, processing of sequentially selecting a plurality of reception side buffer areas and holding the received data in the areas selected over the predetermined time. This brings an effect that the voltage conversion is performed on the transmission data held in the transmission side buffer.

In addition, in the first aspect, it is preferable that the plurality of transmission side buffer areas is respectively associated with reception side buffer areas different from each other, the voltage conversion unit includes a plurality of level shifters each provided with an input terminal and an output terminal, the input terminal of each of the plurality of level shifters is connected to a corresponding one of the transmission side buffer areas different from each other, and the output terminal is connected to one of the reception side buffer areas respectively corresponding to the transmission side buffer areas connected, and the plurality of level shifters each convert a voltage of the received data from the input terminal to output the voltage to the output terminal. This brings about an effect that voltage conversion is performed on the transmission data held in the transmission side buffer areas.

In addition, in the first aspect, the transmission side buffer may include: the plurality of transmission side buffer areas; and a transmission control unit that starts, at the start timing, the processing of sequentially selecting the plurality of transmission side buffer areas and holding the transmission data in the areas selected over the predetermined time, as transmission side buffering processing. This brings about an effect that the plurality of transmission side buffer areas is sequentially selected and the transmission data are held.

In addition, in the first aspect, the reception side buffer may include: the plurality of reception side buffer areas, and a transmission control unit that starts, when the delay time has elapsed from the start timing, the processing of sequentially selecting the plurality of reception side buffer areas and holding the received data in the areas selected over the predetermined time, as reception side buffering processing. This brings about an effect that the plurality of reception side buffer areas is sequentially selected and the transmission data are held.

In addition, in the first aspect, it is preferable that the transmission side buffer starts the transmission side buffering processing when an enable signal indicating the start timing is input, the transmission side buffer starts the reception side buffering processing when the enable signal is input, and the reception side buffer further includes a delay unit that delays the enable signal and supplies the enable signal delayed to the transmission side control unit. This brings about an effect that the enable signal delayed is supplied to the transmission side control unit.

In addition, in the first aspect, a selector may be further included that sequentially selects the plurality of reception side buffer areas and outputs the received data held in the areas selected. This brings about an effect that the received data held in the plurality of reception side buffer areas are sequentially output.

In addition, in the first aspect, the transmission data may include a vertical synchronization signal and valid data. This brings about an effect that the voltage conversion is performed on the vertical synchronization signal and the valid data.

In addition, a second aspect of the present technology is a data transfer system including: a transmission side buffer that starts, at a start timing, processing of sequentially selecting a plurality of transmission side buffer areas and holding transmission data in the areas selected over a predetermined time; a voltage conversion unit that performs voltage conversion on the transmission data held and outputs the transmission data as received data; a reception side buffer that starts, when a delay time less than the predetermined time has elapsed from the start timing, processing of sequentially selecting a plurality of reception side buffer areas and holding the received data in the areas selected over the predetermined time; and a data reception unit that processes the received data held. This brings about an effect that the transmission data held in the transmission side buffer is subjected to the voltage conversion and is processed.

In addition, in the second aspect, an analog signal output unit may be further included that converts the received data into an analog signal and outputs the analog signal. This brings about an effect that the analog signal is output.

Effects of the Invention

According to the present technology, an excellent effect can be exerted that the number of wiring lines can be reduced in the system that transfers data between the different power domains. Note that, the effect described here is not necessarily limited, and can be any effect described in the present disclosure.

BRIEF DESCRIPTION OF DRAWINGS

FIG. 5 is a diagram illustrating an example of operation of a one-hot state counter in the first embodiment of the present technology.

FIG. 6 is a diagram illustrating an example of operation of a register in the first embodiment of the present technology.

MODE FOR CARRYING OUT THE INVENTION

The following is a description of a mode for carrying out the present technology (the mode will be hereinafter referred to as the embodiment). The description will be made in the following order.

Figure 1:
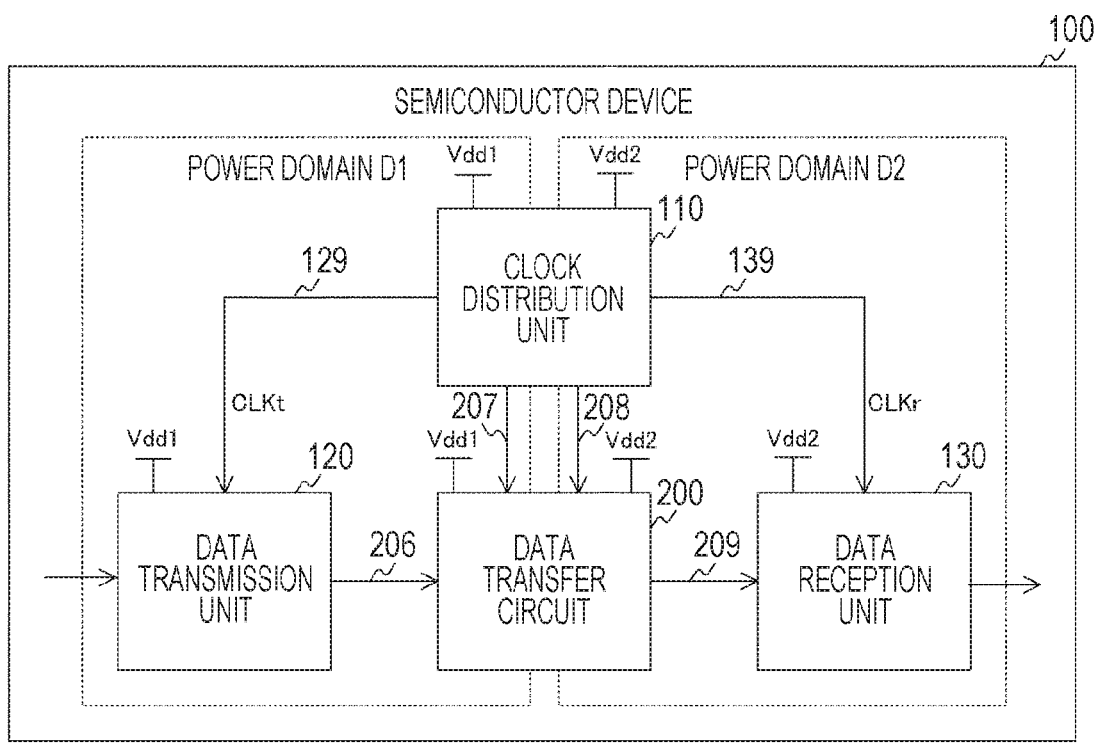
FIG. 1 is a block diagram illustrating a configuration example of a semiconductor device in a first embodiment of the present technology.

1. First embodiment (an example in which a level shifter is arranged between a register on the transmission side and a register on the reception side)
2. Second embodiment (an example in which a level shifter is arranged between a transmission side register and a reception side register to transfer image data)
3. Modification 1. First Embodiment Configuration Example of Semiconductor Device FIG. 1 is a block diagram illustrating a configuration example of a semiconductor device 100 in a first embodiment. The semiconductor device 100 includes a clock distribution unit 110, a data transmission unit 120, a data transfer circuit 200, and a data reception unit 130.

In addition, an area in the semiconductor device 100 is divided into a plurality of power domains (for example, power domains D1 and D2) respectively having different power supply voltages, from a viewpoint of saving power consumption. The clock distribution unit 110 and the data transfer circuit 200 are arranged at the boundary between the power domains D1 and D2. In addition, the data transmission unit 120 is arranged in the power domain D1, and the data reception unit 130 is arranged in the power domain D2. A power supply voltage Vdd1 is supplied to a circuit in the power domain D1, and a power supply voltage Vdd2 different from the power supply voltage Vdd1 is supplied to a circuit in the power domain D2.

The clock distribution unit 110 distributes a clock signal to each of circuits in the semiconductor device 100. The clock distribution unit 110 generates a transmission side clock signal CLKt, and supplies the clock signal to the data transmission unit 120 and the data transfer circuit 200 via signal lines 129 and 207. In addition, the clock distribution unit 110 generates a reception side clock signal CLKr and supplies the clock signal to the data transfer circuit 200 and the data reception unit 130 via signal lines 208 and 139.

The data transmission unit 120 transmits data to the data transfer circuit 200 via a signal line 206 in synchronization with the transmission side clock signal CLKt. The data reception unit 130 receives the data from the data transfer circuit 200 via a signal line 209 in synchronization with the reception side clock signal CLKr.

The data transfer circuit 200 performs voltage conversion on and buffers the data from the data transmission unit 120, and transfers the data to the data reception unit 130 via the signal line 209. Here, a reason why the data transfer circuit 200 buffers the data is to reduce influence of delay caused by the voltage conversion and to transfer the data without interruption.

Note that, a system in which the semiconductor device 100 is provided is an example of a data transfer system described in the claims.

[Configuration Example of Clock Distribution Unit]

Figure 2:
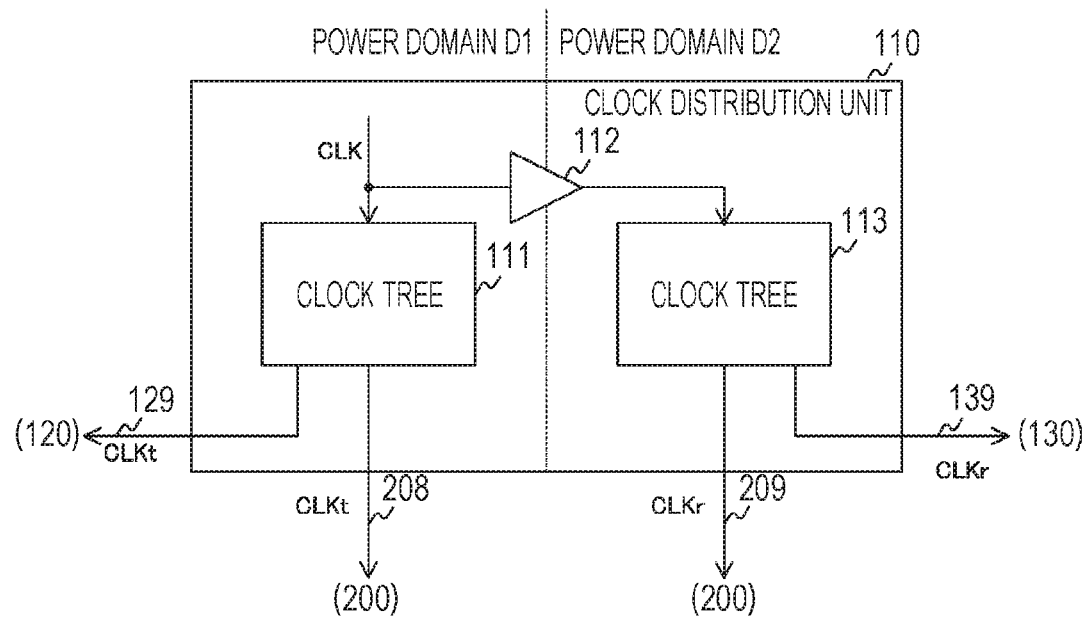
FIG. 2 is a circuit diagram illustrating a configuration example of a clock distribution unit in the first embodiment of the present technology.

FIG. 2 is a circuit diagram illustrating a configuration example of the clock distribution unit 110 in the first embodiment. The clock distribution unit 110 includes clock trees 111 and 113, and a level shifter 112. The clock tree 111 is arranged in the power domain D1, and the level shifter 112 is arranged on the boundary between the power domains D1 and D2. In addition, the clock tree 113 is arranged in the power domain D2.

The clock tree 111 distributes an original clock signal CLK of a predetermined frequency to a plurality of circuits. The clock tree 111 distributes the clock signal as the transmission side clock signal CLKt to the data transmission unit 120 and the data transfer circuit 200.

The level shifter 112 converts a voltage of the original clock signal CLK from Vdd1 to Vdd2. The level shifter 112 supplies the signal after the conversion to the clock tree 113. The clock tree 113 distributes the clock signal from the level shifter 112 to a plurality of circuits. The clock tree 113 distributes the clock signal as the reception side clock signal CLKr to the data transfer circuit 200 and the data reception unit 130.

As described above, since the transmission side clock signal CLKt and the reception side clock signal CLKr are obtained by distributing the original clock signal, the frequencies of these signals are the same. However, due to the clock trees 111 and 113 and the level shifter 112, a phase difference occurs between the transmission side clock signal CLKt and the reception side clock signal CLKr.

[Configuration Example of Data Transfer Circuit]

Figure 3:
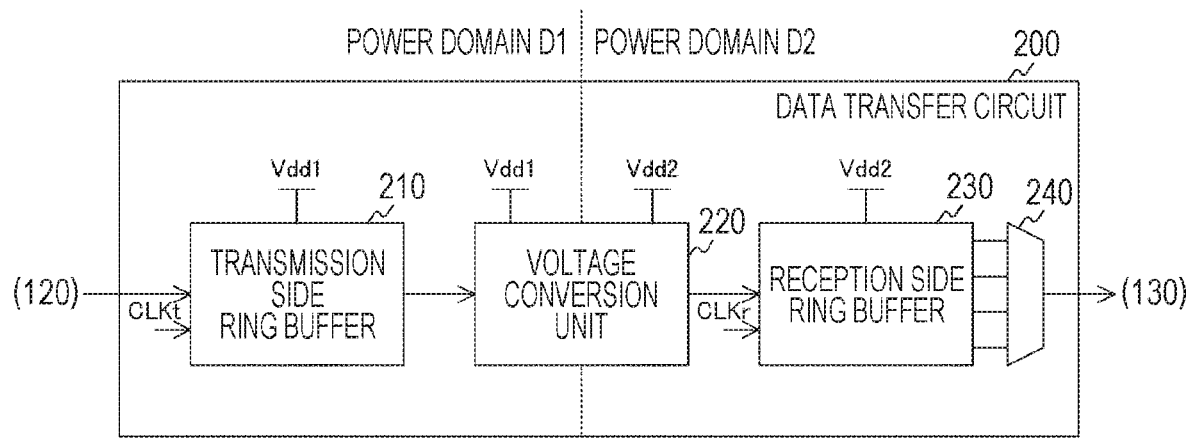
FIG. 3 is a block diagram illustrating a configuration example of a data transfer circuit in the first embodiment of the present technology.

FIG. 3 is a block diagram illustrating a configuration example of the data transfer circuit 200 in the first embodiment. The data transfer circuit 200 includes a transmission side ring buffer 210, a voltage conversion unit 220, a reception side ring buffer 230, and a selector 240. N (N is an integer) buffer areas are provided in the transmission side ring buffer 210. In addition, the same number (N) of buffer areas are provided in the reception side buffer area 230.

The transmission side ring buffer 210 sequentially holds data in the N buffer areas in synchronization with the transmission side clock signal CLKt. The transmission side ring buffer 210 supplies the data held as transmission data to the voltage conversion unit 220. The data structure of the N buffer areas is ring-shaped. For this reason, the s-th (s is an integer) transmission data input to the transmission side ring buffer 210 is held over a period until the (s+N+1)-th data is input. Note that, the transmission side ring buffer 210 is an example of a transmission side buffer described in the claims.

The voltage conversion unit 220 performs voltage conversion on the transmission data held in the transmission side ring buffer 210. The voltage conversion unit 220 outputs the transmission data after the voltage conversion as received data to the reception side ring buffer 230.

The reception side ring buffer 230 sequentially holds the received data in the N buffer areas in synchronization with the reception side clock signal CLKr. The data structure of the N buffer areas is also ring-shaped as in the transmission side. Note that, the reception side ring buffer 230 is an example of a reception side buffer described in the claims.

The selector 240 sequentially selects the received data held in the reception side ring buffer 230 and outputs the received data to the data reception unit 130.

Note that, the data transfer circuit 200 transfers the data only in one direction from the power domain D1 to the power domain D2; however, the data may be transferred bidirectionally between these power domains. In that case, it is sufficient that a circuit similar to the transmission side ring buffer 210 is provided in the power domain D2, circuits similar to the reception side ring buffer 230 and the selector 240 are provided in the power domain D1, and a circuit similar to the voltage conversion unit 220 is arranged therebetween.

[Configuration Example of Transmission Side Ring Buffer]

Figure 4:
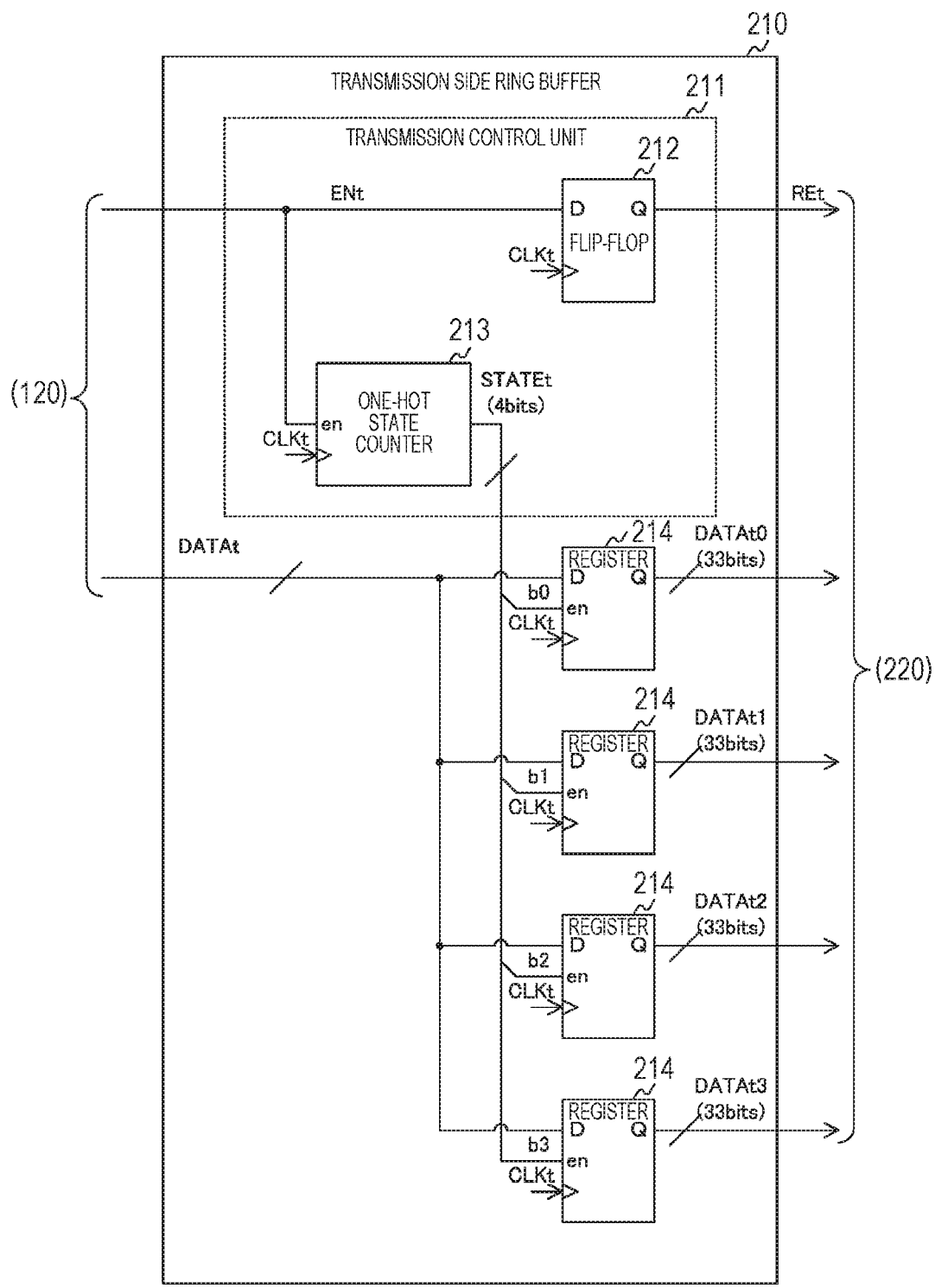
FIG. 4 is a circuit diagram illustrating a configuration example of a transmission side ring buffer in the first embodiment of the present technology.

FIG. 4 is a circuit diagram illustrating a configuration example of the transmission side ring buffer 210 in the first embodiment. The transmission side ring buffer 210 includes a transmission control unit 211 and N registers 214.

The transmission control unit 211 sequentially controls the registers 214 in synchronization with the transmission side clock signal CLKt to hold transmission data DATAt. The transmission control unit 211 includes a flip-flop 212 and a one-hot state counter 213.

The flip-flop 212 delays an enable signal ENt in synchronization with the transmission side clock signal CLKt. Here, the enable signal ENt is a signal indicating whether or not to validate the transmission side ring buffer 210. For example, the enable signal ENt is set to the high level in a case where the buffer is validated, and is set to the low level in a case where the buffer is invalidated. The flip-flop 212 supplies the enable signal delayed as a ready signal REt to the voltage conversion unit 220.

The one-hot state counter 213 counts a counter value STATEt in synchronization with the transmission side clock signal CLKt. A bit depth of the counter value STATEt is the same as the number of the registers 214. That is, the counter value STATEt is of N bits. In addition, the one-hot state counter 213 inputs the n-th (n is an integer from 0 to N−1) bit bn of the counter value STATEt to an enable terminal en of the n-th register 214.

Then, in a case where the enable signal ENt is at the low level (disable), the one-hot state counter 213 sets all bits of the counter value STATEt to "0".

On the other hand, in a case where the enable signal ENt is at the high level (enable), the one-hot state counter 213 sequentially selects any one of the N registers 214 in synchronization with the transmission side clock signal CLKt. At this time, the one-hot state counter 213 sets only a bit corresponding to one of the registers 214 selected to "1", in the counter value STATEt.

For example, in a case where the number of the registers 214 is four, the one-hot state counter 213 counts the counter value STATEt of four bits. In a case where the enable signal ENt is at the low level, the one-hot state counter 213 sets the counter value STATEt to "0000" in a binary number.

On the other hand, in a case where the enable signal ENt is at the high level, the one-hot state counter 213 changes the counter value STATEt to "0001" at 4t-th (t is an integer) clock, and changes the value to "0010" at the (4t+1)-th clock. In addition, the one-hot state counter 213 changes the counter value STATEt to "0100" at the (4t+2)-th clock and changes the value to "1000" at the (4t+3)-th clock. As described above, the counter value STATEt is cyclically changed.

The registers 214 each hold the transmission data DATAt of M (M is an integer) bits in synchronization with the transmission side clock signal CLKt. Each of the registers 214 is used as a buffer area in the transmission side ring buffer 210.

In addition, in a case where the corresponding bit of the counter value STATEt is at the high level, the registers 214 each take in and hold the transmission data DATAt in synchronization with the transmission side clock signal CLKt. Then, the n-th register 214 supplies the transmission data DATAt held as DATAtn to the voltage conversion unit 220.

FIG. 5 is a diagram illustrating an example of operation of the one-hot state counter 213 in the first embodiment. In a case where the enable signal ENt is at the low level (disable), the one-hot state counter 213 initializes all the bits of the counter value STATEt to "0".

On the other hand, in a case where the enable signal ENt is at the high level (enable), the one-hot state counter 213 updates the counter value STATEt at a timing when the transmission side clock signal CLKt rises. In addition, in a period in which the enable signal ENt is at the high level and other than the rising edge of the transmission side clock signal CLKt, the one-hot state counter 213 holds the counter value STATEt without updating the value.

FIG. 6 is a diagram illustrating an example of operation of the registers 214 in the first embodiment. In a case where the corresponding bit bn of the counter value STATEt is at the high level, the registers 214 each update the data at the timing when the transmission side clock signal CLKt rises. In other periods, the registers 214 each hold the data.

[Configuration Example of Voltage Conversion Unit]

Figure 7:
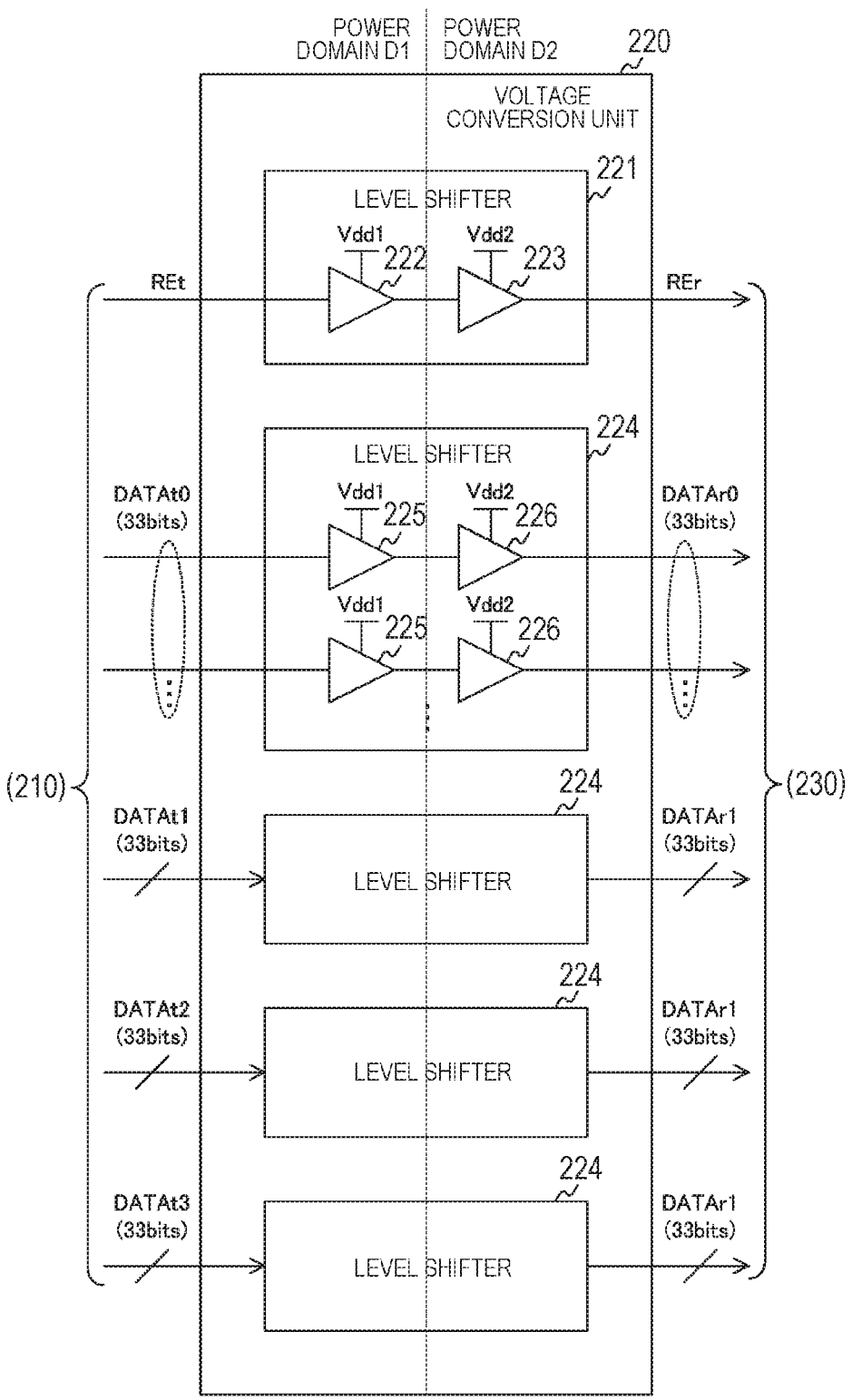
FIG. 7 is a circuit diagram illustrating a configuration example of a voltage conversion unit in the first embodiment of the present technology.

FIG. 7 is a circuit diagram illustrating a configuration example of the voltage conversion unit 220 in the first embodiment. The voltage conversion unit 220 includes a level shifter 221 and N level shifters 224.

The level shifter 221 converts a voltage of the ready signal REt. The level shifter 221 includes level shift buffers 222 and 223.

The level shift buffer 222 outputs the power supply voltage Vdd1 to the level shift buffer 223 in a case where the ready signal REt is at the high level, and outputs a predetermined ground voltage to the level shift buffer 223 in a case where the ready signal REt is at the low level.

The level shift buffer 223 outputs the power supply voltage Vdd2 in a case where a signal from the level shift buffer 222 is at the high level (Vdd1), and outputs the predetermined ground voltage in a case where the signal is at the low level.

Through the level shift buffers 222 and 223, the voltage of the signal is converted from Vdd1 to Vdd2. The level shifter 221 outputs the signal after the voltage conversion as a ready signal REr to the reception side ring buffer 230.

The level shifters 224 each convert a voltage of the transmission data. The level shifters 224 each includes M circuits each including level shift buffers 225 and 226. The configurations of the level shift buffers 225 and 226 are similar to those of the level shift buffers 222 and 223.

In addition, an input terminal of the n-th level shifter 224 among the N level shifters is connected to the n-th register 214. In addition, an output terminal of the n-th level shifter 224 is connected to the n-th register on the reception side as described later.

As described above, M level shift buffers 225 and 226 are provided for each of the N level shifters 224, and are connected to the transmission side and the reception side. Therefore, N×M level shift buffers 225 and 226 are provided in the entire voltage conversion unit 220. In addition, the number of wiring lines between the transmission side ring buffer 210 and the level shifters 224 is N×M.

[Configuration Example of Reception Side Ring Buffer]

Figure 8:
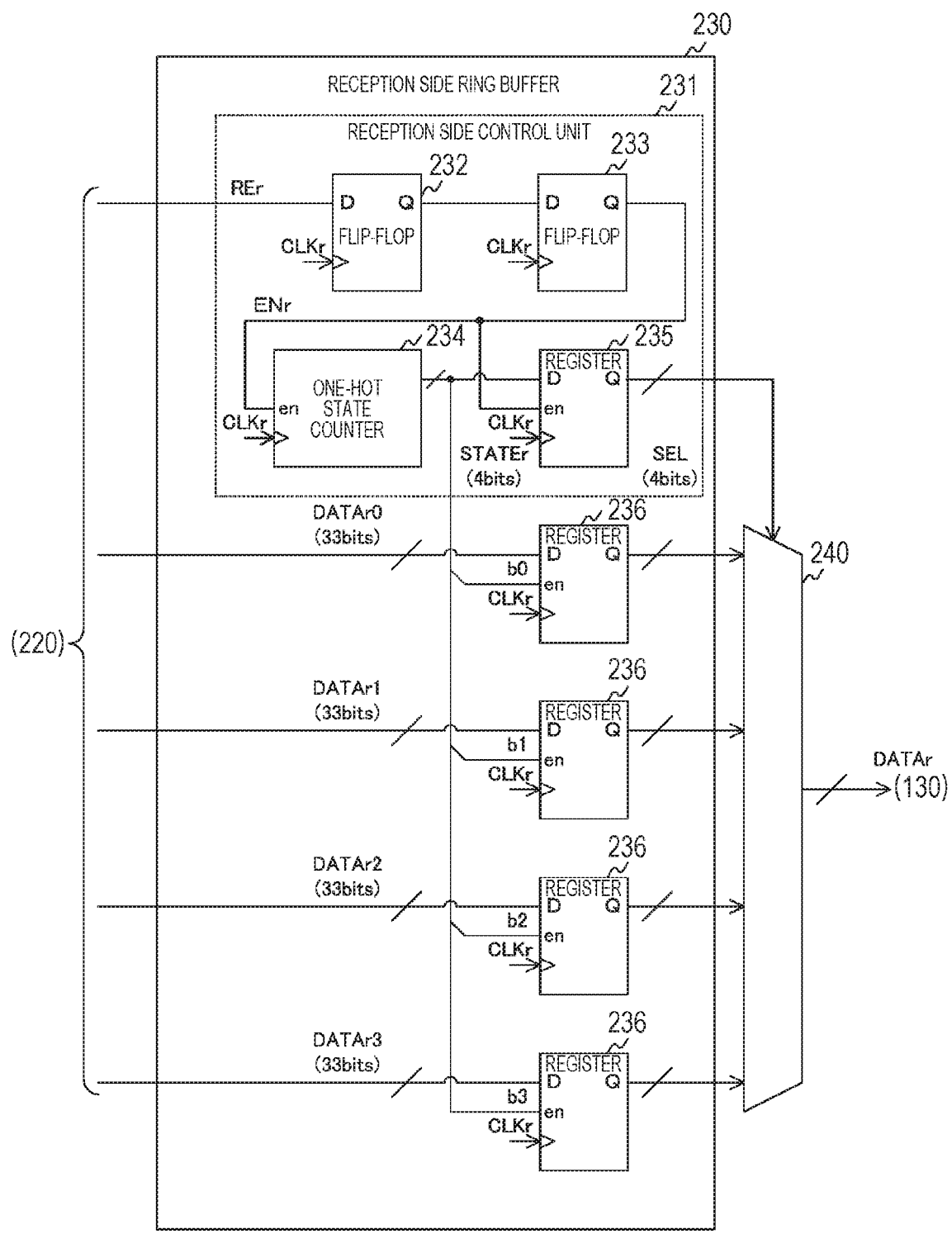
FIG. 8 is a circuit diagram illustrating a configuration example of a reception side ring buffer in the first embodiment of the present technology.

FIG. 8 is a circuit diagram illustrating a configuration example of the reception side ring buffer 230 in the first embodiment. The reception side ring buffer 230 includes a reception side control unit 231 and N registers 236.

The reception side control unit 231 includes flip-flops 232 and 233, a one-hot state counter 234, and a register 235.

The flip-flops 232 and 233 delay the ready signal REr in synchronization with the reception side clock CLKr. The flip-flop 233 supplies the ready signal REr delayed as an enable signal ENr to the one-hot state counter 234. Note that, a circuit including the flip-flops 232 and 233 is an example of a delay unit described in the claims.

The configuration of the one-hot state counter 234 is similar to that of the one-hot state counter 213 on the transmission side. The one-hot state counter 234 inputs a counter value STATEr to the register 235, and inputs the n-th bit of the counter value STATEr to an enable terminal en of the n-th register 236.

The configuration of the register 235 is similar to that of each of the registers 236. The register 235 delays the counter value STATEr in synchronization with the reception side clock CLKr, and supplies the counter value to the selector 240.

The configurations of the registers 236 are similar to those of the registers 214 on the transmission side except that the registers 236 operate in synchronization with the reception side clock signal CLKr.

The selector 240 selects one of the registers 236 corresponding to a bit of "1" of the counter value STATEr from the register 235. The selector 240 outputs the received data held in the one of the registers 236 selected as DATAr to the data reception unit 130.

Figure 9:
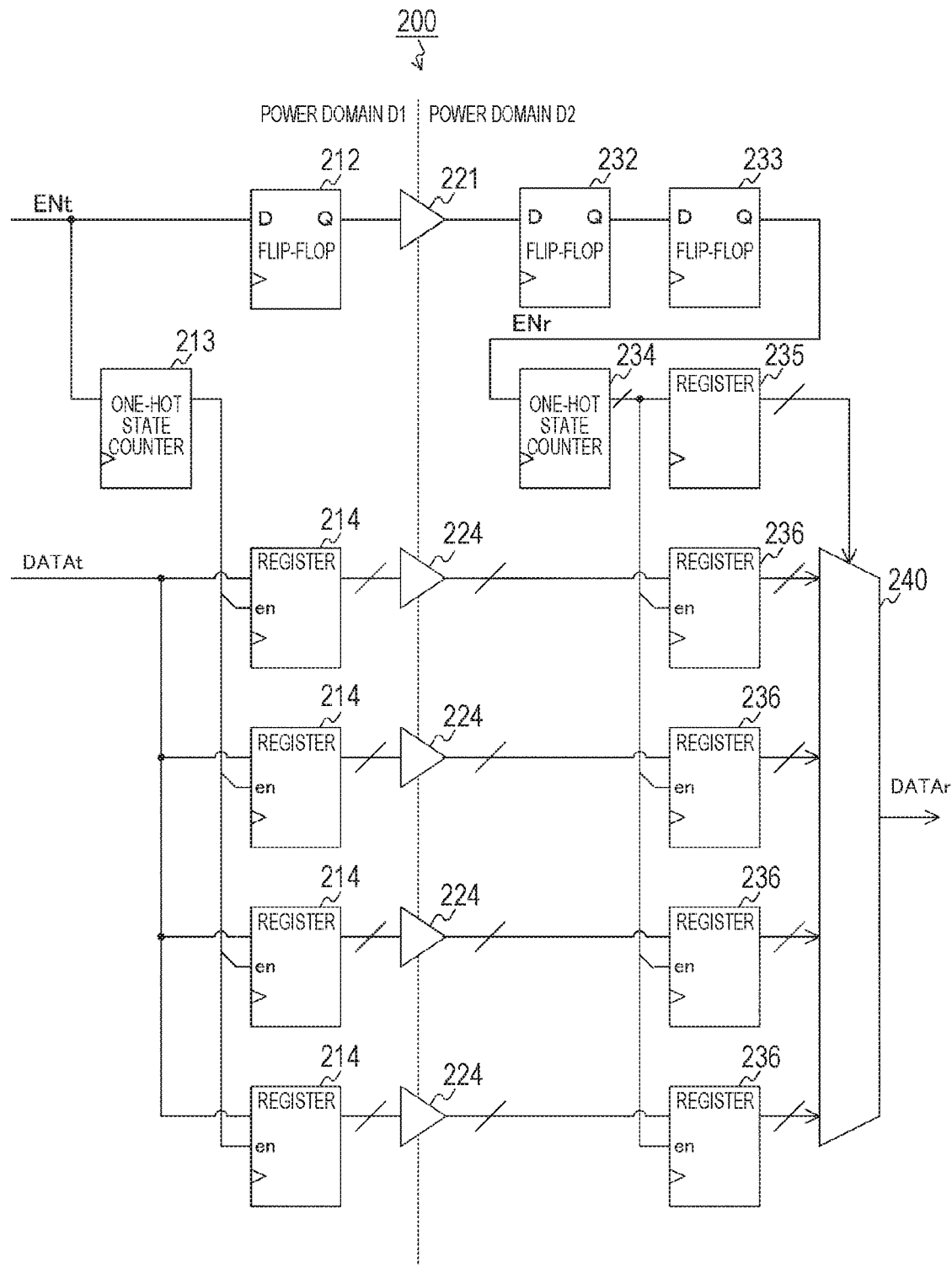
FIG. 9 is an example of an overall view of the data transfer circuit in the first embodiment of the present technology.

FIG. 9 is an example of an overall view of the data transfer circuit 200 in the first embodiment. As illustrated in FIGS. 4 to 8, the N registers 214 are arranged in the power domain D1 that is the transmission side of the data transfer circuit 200, and the N registers 236 are arranged in the power domain D2 that is the reception side. One of the level shifters 224 is arranged between the n-th register 214 and the n-th register 236.

In addition, when the enable signal ENt becomes at the high level (enable), the one-hot state counter 213 starts processing of cyclically selecting the N registers 214 and holding the transmission data. The transmission data is subjected to voltage conversion by the level shifters 224 and input to the registers 236 as the transmission data.

On the other hand, when the enable signal ENr delayed by the flip-flop 212 and the like becomes at the high level, the one-hot state counter 234 starts processing of cyclically selecting the N registers 236 and holding the received data. The selector 240 cyclically selects and outputs the N pieces of the received data.

Here, a delay time Td of the enable signal ENr on the reception side with respect to the enable signal ENt on the transmission side is set within a range represented by the following expression.

$$T_{Phase}+T_{Shift}<Td<(N+1)-P$$

In the above expression, $T_{Phase}$ is a delay time (phase difference) of the rising edge of the reception side clock signal CLKr with respect to the rising edge of the transmission side clock signal CLKt. $T_{Shift}$ is a delay time by the level shifter 221. P is a period of the transmission side clock signal CLKt.

In addition, the number of the registers 214, N, is determined depending on a delay time of a timing at which the reception side ring buffer 230 receives the data with respect to a sending out timing at which the transmission side ring buffer 210 sends out the data. For example, in a case where N is (A+2), a delay of the reception side with respect to the sending out timing of the transmission side is allowed up to A clocks. Since N=4 in FIG. 9, a delay of up to two clocks is allowed. If the number of the registers 214, N, is increased, the allowable delay can be increased, but the number of wiring lines and the number of the level shifters 224 are correspondingly increased. For this reason, the value of N is set in consideration of ease of timing design and increase in the number of wiring lines and the like.

Figure 10:
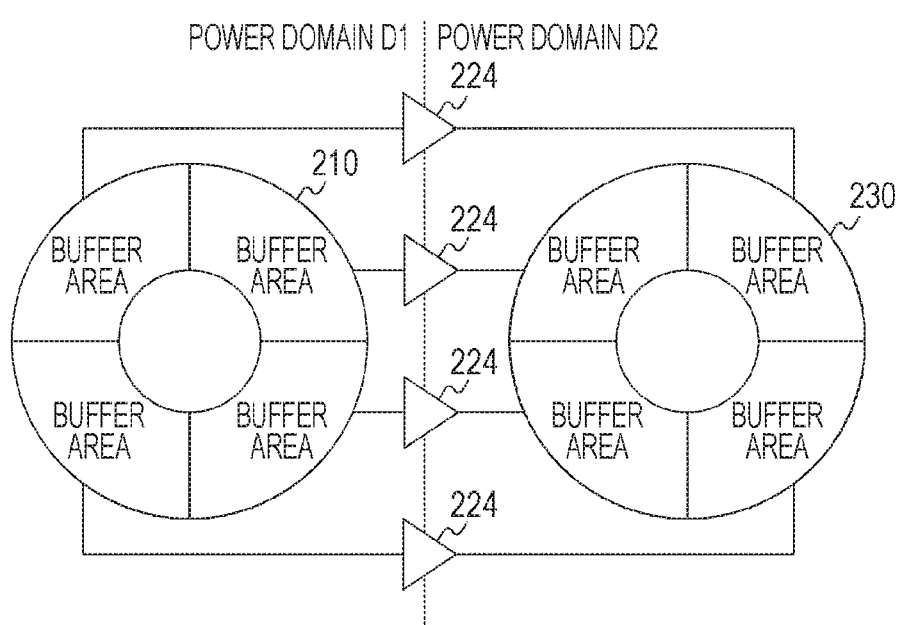
FIG. 10 is a diagram illustrating an example of data structures of the transmission side ring buffer and the reception side ring buffer in the first embodiment of the present technology.

FIG. 10 is a diagram illustrating an example of data structures of the transmission side ring buffer 210 and the reception side ring buffer 230 in the first embodiment. In FIG. 10, four buffer areas connected together in a ring shape correspond to the registers 214 or the registers 236 in FIG. 9. The ring-shaped connection structure of FIG. 9 illustrates a logical data structure, not a physical structure of the registers.

Figure 11:
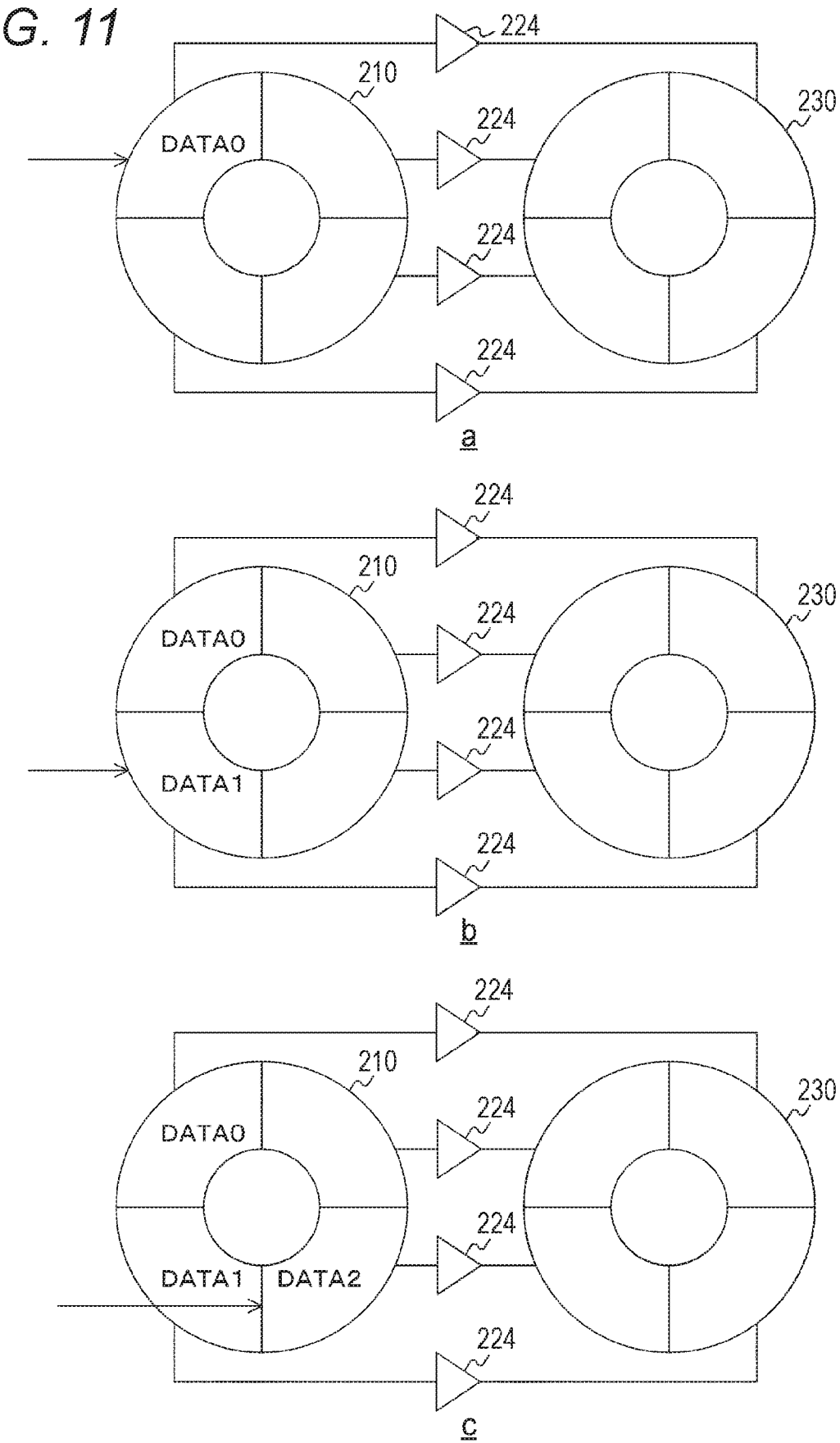
FIG. 11 is a diagram for explaining operation of the transmission side ring buffer in the first embodiment of the present technology.

FIG. 11 is a diagram for explaining operation of the transmission side ring buffer 210 in the first embodiment. It is assumed that the enable signal ENt is set to the high level, and data DATA0 is input to the transmission side ring buffer 210 at the 4t-th clock. The transmission side ring buffer 210 sets the counter value STATEt to "0001", and holds the data DATA0 in one of the registers 214 corresponding to the counter value, as illustrated in a of FIG. 11.

When data DATA1 is input at the (4t+1)-th clock, the transmission side ring buffer 210 sets the counter value STATEt to "0010", and holds the data DATA1 in one of the registers 214 corresponding to the counter value, as illustrated in b in FIG. 11.

When data DATA2 is input at the (4t+2)-th clock, the transmission side ring buffer 210 sets the counter value STATEt to "0100", and holds the DATA2 in one of the registers 214 corresponding to the counter value, as illustrated in c in FIG. 11.

Figure 12:
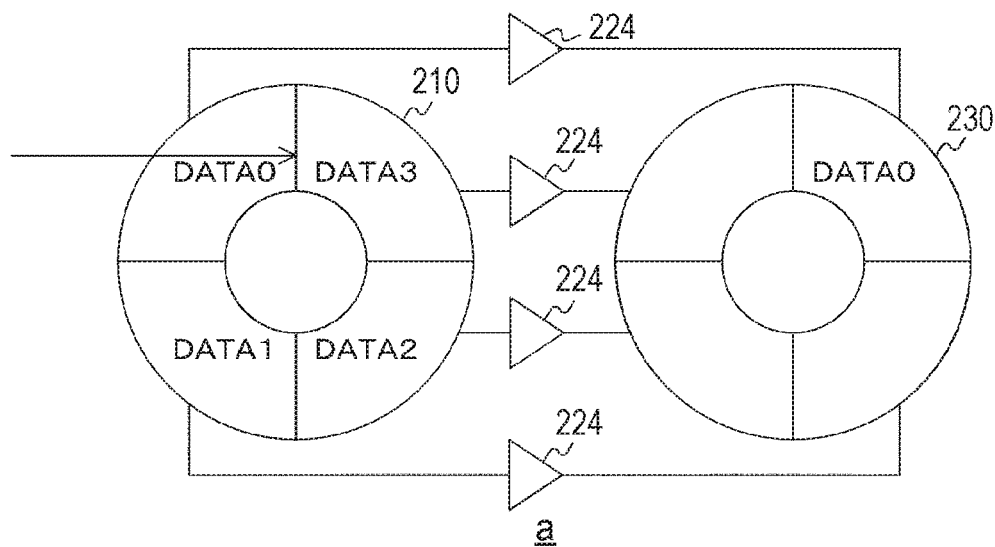
FIG. 12 is a diagram for explaining operation of the reception side ring buffer in the first embodiment of the present technology.
Figure 12:
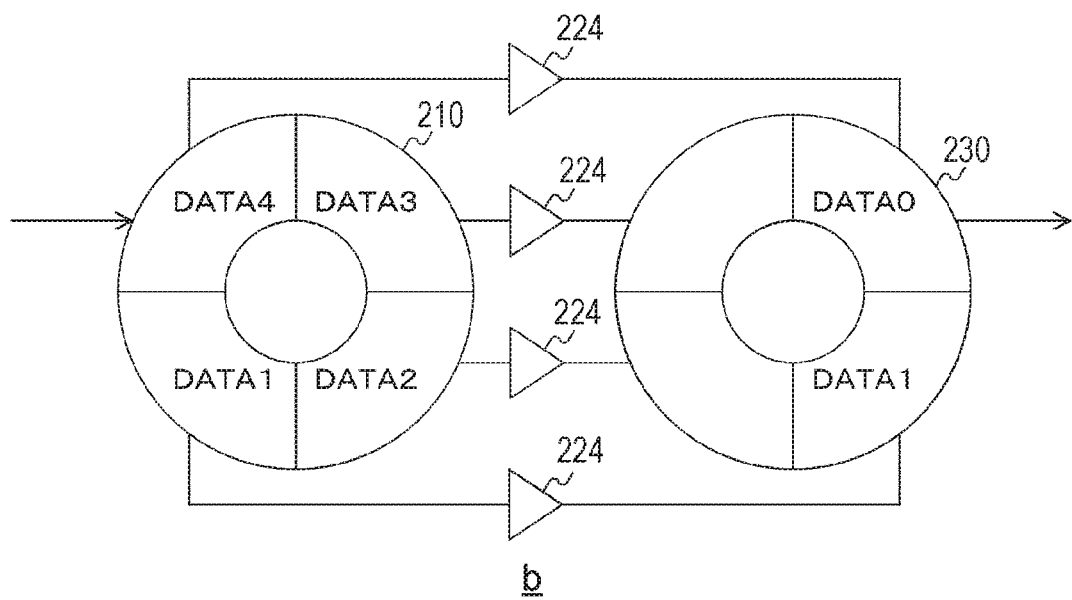

FIG. 12 is a diagram for explaining operation of the reception side ring buffer 230 in the first embodiment.

When data DATA3 is input at the (4t+3)-th clock, the transmission side ring buffer 210 sets the counter value STATEt to "1000", and holds the data DATA3 in one of the registers 214 corresponding to the counter value, as illustrated in a in FIG. 12. In addition, the reception side ring buffer 230 sets the counter value STATEr to "0001", and holds the data DATA0 in one of the registers 236 corresponding to the counter value.

When the data DATA4 is input at the (4t+4)-th clock, the transmission side ring buffer 210 sets the counter value STATEt to "0001", and holds the data DATA4 in one of the registers 214 corresponding to the counter value, as illustrated in b in FIG. 12. In addition, the reception side ring buffer 230 sets the counter value STATEr to "0010", and holds the data DATA0 in one of the registers 236 corresponding to the counter value.

As illustrated in FIGS. 11 and 12, each of the N pieces of the transmission data is held in the transmission side ring buffer 210 over a certain time, and the data is delayed by the time Td less than the certain time and transferred to the reception side ring buffer 230 to be held. For this reason, the N pieces of the data are held aligned in order of arrival in the reception side ring buffer 230 without interruption, and the number of wiring lines between the power domains is only that for N systems. In addition, before the data (DATA0 and the like) is updated due to one round of the counter value STATEt of the transmission side ring buffer 210, the data is held in the reception side ring buffer 230. As a result, the data is transferred without interruption between the power domains.

Figure 13:
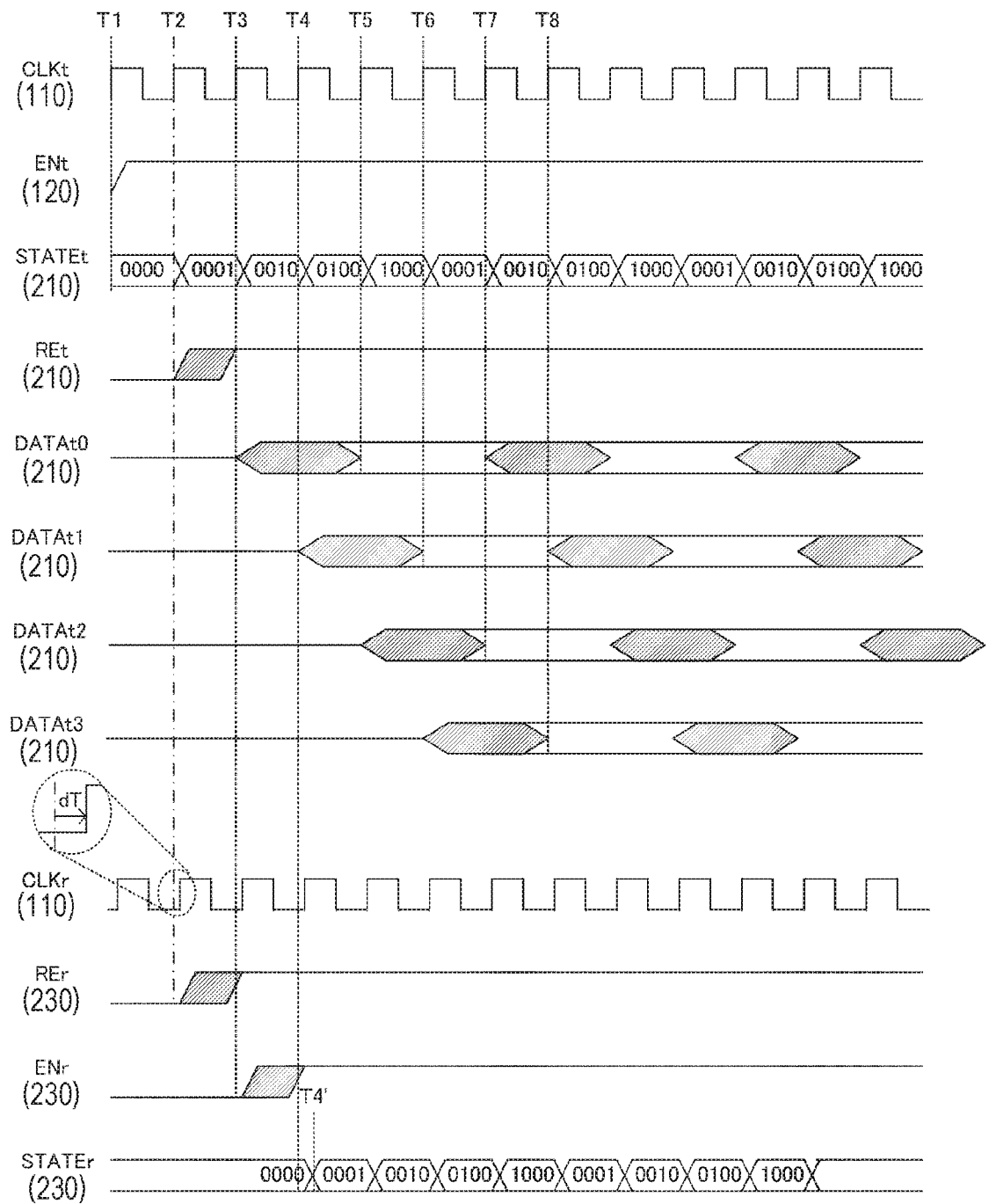
FIG. 13 is a timing chart illustrating an example of operation of the data transfer circuit of a case 0 in the first embodiment of the present technology.

FIG. 13 is a timing chart illustrating an example of operation of the data transfer circuit 200 of a case 0 in the first embodiment. In the case 0, the rising edge of the reception side clock signal CLKr is delayed by dT with respect to the rising edge of the transmission side clock signal CLKt. In addition, counting of the counter value STATEr on the reception side is started at a timing T4' immediately after a timing T4 when the enable signal ENr becomes at the high level.

When the enable signal ENt becomes at the high level at a timing T1, the counter value STATEt on the transmission side is controlled to "0001" at a timing T2 of the next clock. Then, at a timing T3 of the next clock, the ready signal REt becomes at the high level, and the enable signal ENr becomes at the high level at the timing T4 of the next clock. At the timing T4' immediately thereafter, the counter value STATEr on the reception side is controlled to "0001".

First transmission data DATAt0 is undefined in two clocks from the timing T3 to a timing T5 and is sent out to the reception side ring buffer 230 at the timing T5. Hatched portions indicate that the data are undefined. Second and subsequent transmission data DATAt1, DATAt2, and DATAt3 are transmitted at timings T6, T7, and T8, respectively.

Figure 14:
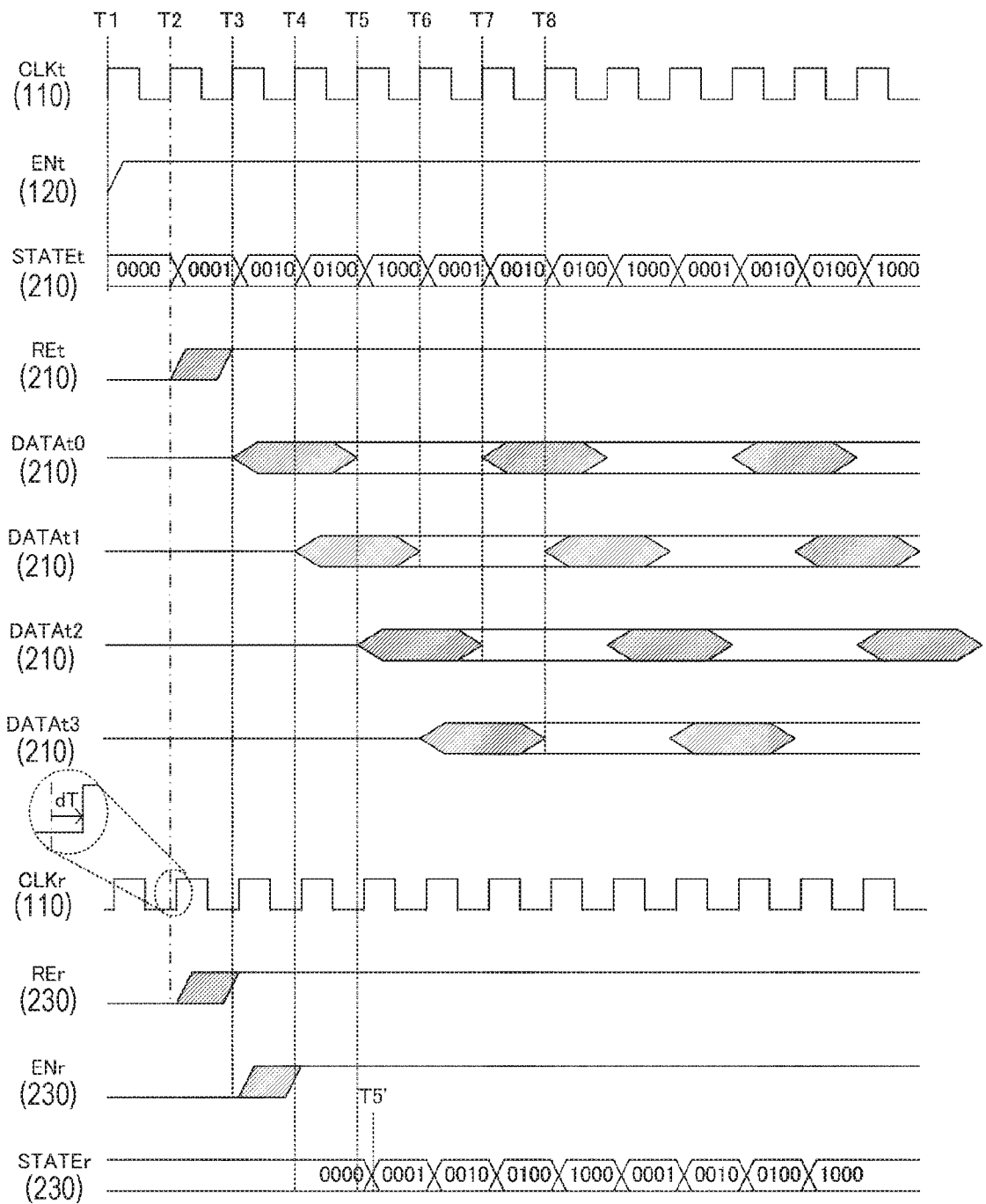
FIG. 14 is a timing chart illustrating an example of operation of the data transfer circuit of a case 1 in the first embodiment of the present technology.

FIG. 14 is a timing chart illustrating an example of operation of the data transfer circuit 200 of a case 1 in the first embodiment. In the case 1, the rising edge of the reception side clock signal CLKr is delayed by dT with respect to the rising edge of the transmission side clock signal CLKt. In addition, counting of the counter value STATEr on the reception side is started at a timing T5' after the timing T4 when the enable signal ENr becomes at the high level.

Figure 15:
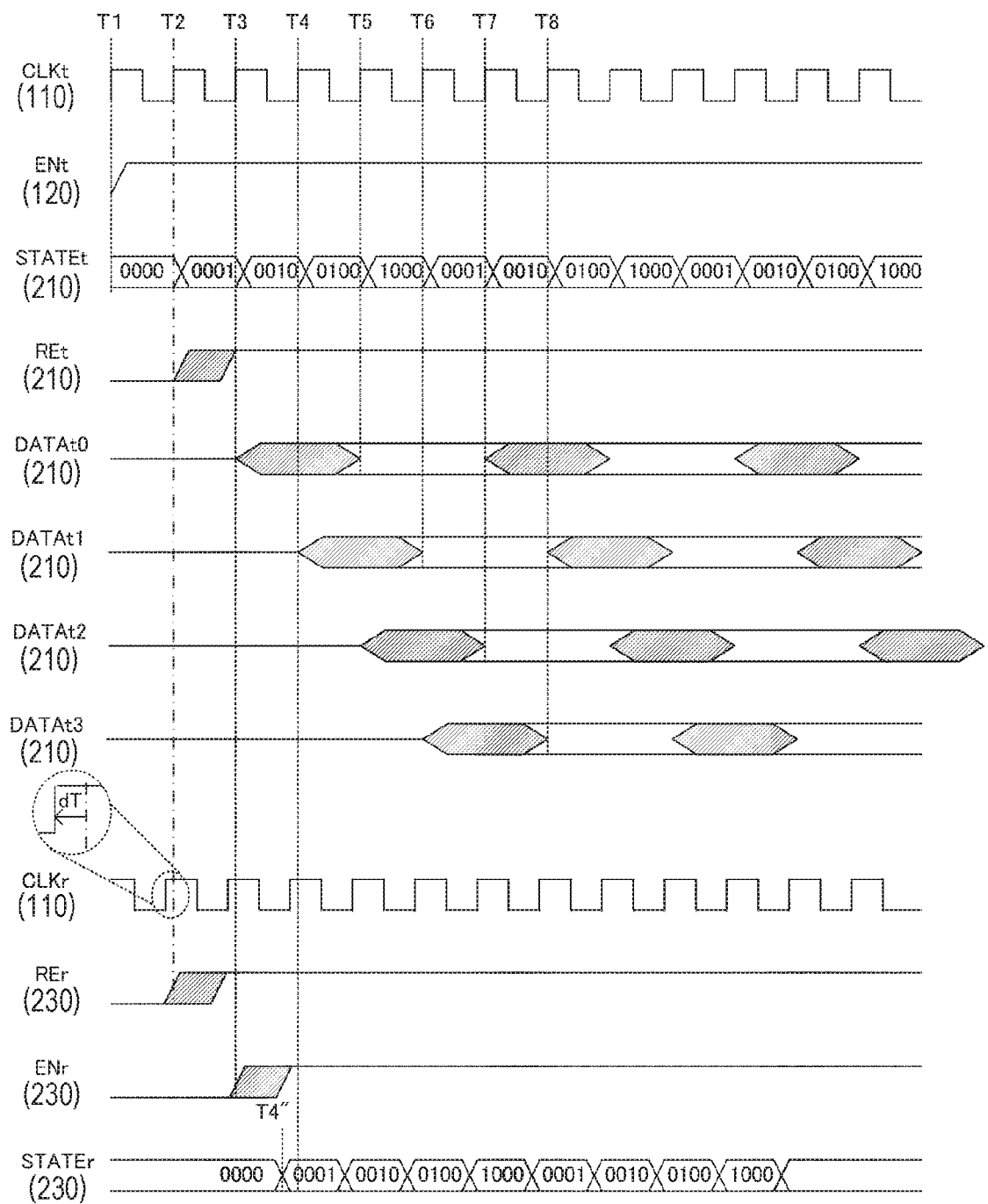
FIG. 15 is a timing chart illustrating an example of operation of the data transfer circuit of a case 2 in the first embodiment of the present technology.

FIG. 15 is a timing chart illustrating an example of operation of the data transfer circuit 200 of a case 2 in the first embodiment. In the case 3, the rising edge of the reception side clock signal CLKr is advanced by dT with respect to the rising edge of the transmission side clock signal CLKt. In addition, counting of the counter value STATEr on the reception side is started at a timing T4" immediately before the timing T4 when the enable signal ENr becomes at the high level.

Figure 16:
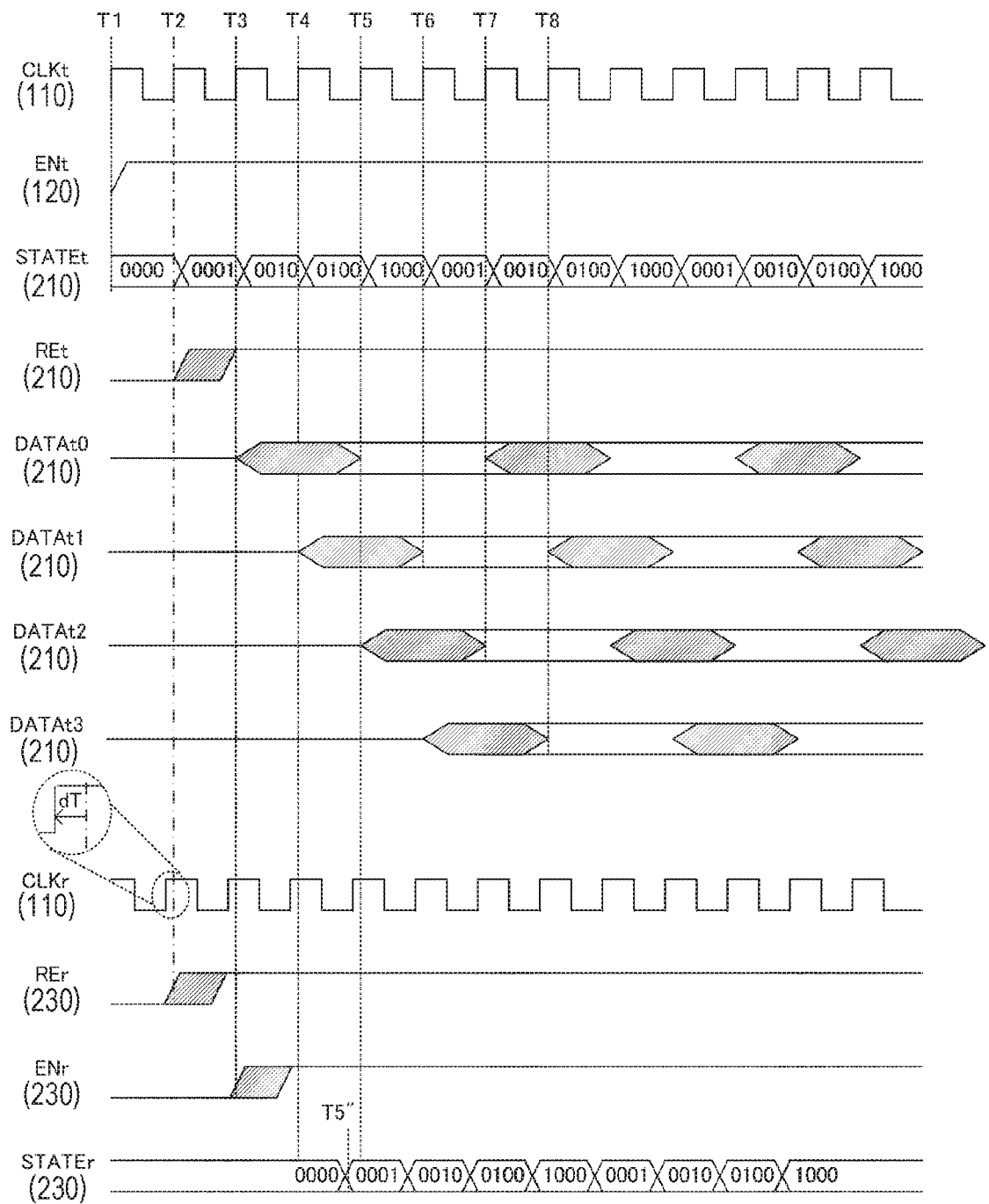
FIG. 16 is a timing chart illustrating an example of operation of the data transfer circuit of a case 3 in the first embodiment of the present technology.

FIG. 16 is a timing chart illustrating an example of operation of the data transfer circuit 200 of a case 3 in the first embodiment. In the case 3, the rising edge of the reception side clock signal CLKr is advanced by dT with respect to the rising edge of the transmission side clock signal CLKt. Counting of the counter value STATEr on the reception side is started at a timing T5" immediately before the timing T5.

Figure 17:
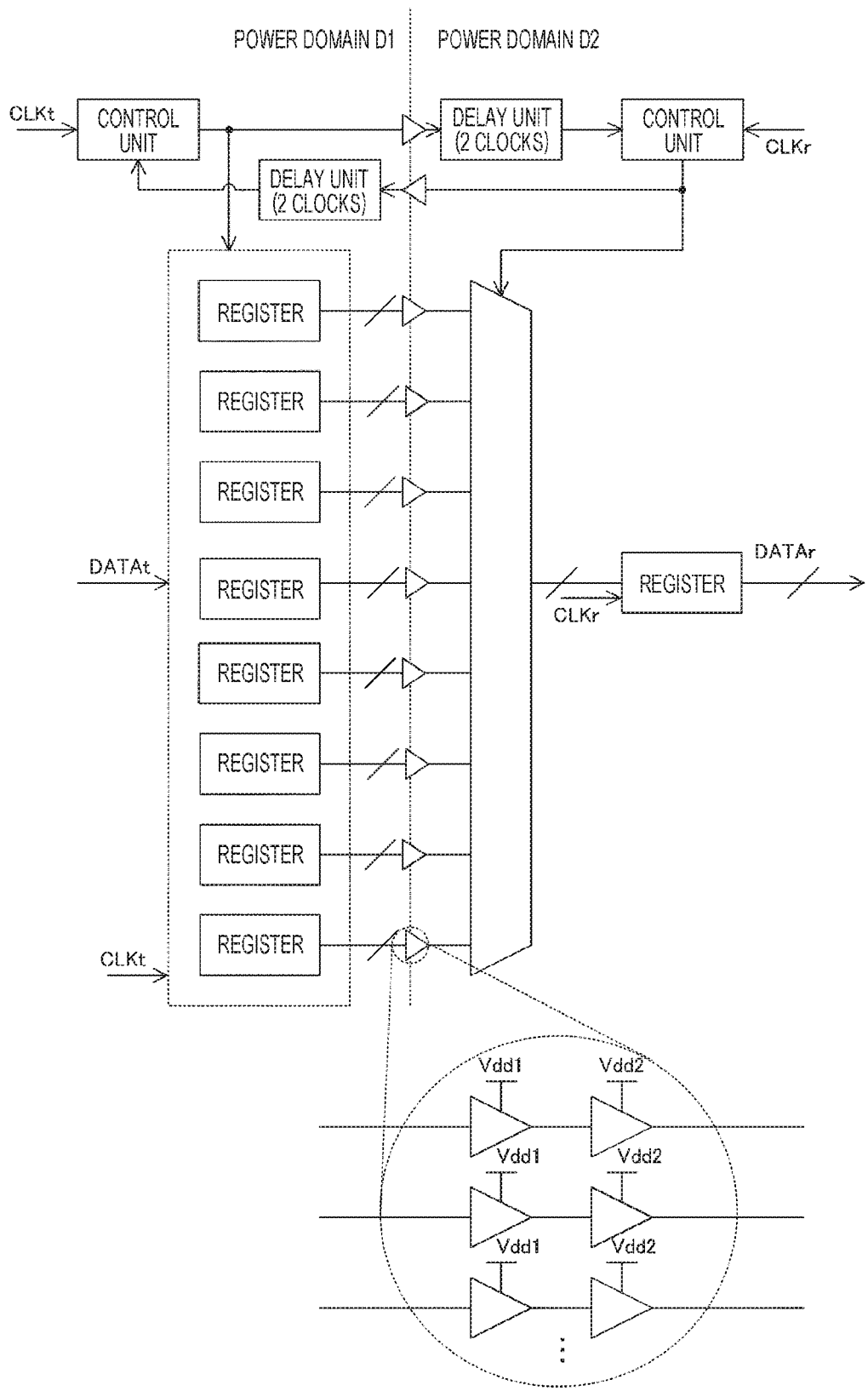
FIG. 17 is a circuit diagram illustrating a configuration example of the data transfer circuit of a comparative example in which level shifters are provided before a selector.

FIG. 17 is a circuit diagram illustrating a configuration example of the data transfer circuit 200 of a comparative example in which level shifters are provided before a selector. In this comparative example, eight stages of registers are provided, and data is held in these registers in a first in first out (FIFO) manner. In addition, a level shifter is arranged between each of the registers and the selector.

In this comparative example, the delay of the reception side with respect to the sending out timing of the transmission side is allowed up to one clock by the eight stages of registers. As a result, influence can be reduced of the delay by the level shifter. However, when 33-bit data is held by the resisters, as many as 33×8 wiring lines are required between the registers and the selector. In addition, the same number (33×8) of level shifters are required.

Figure 18:
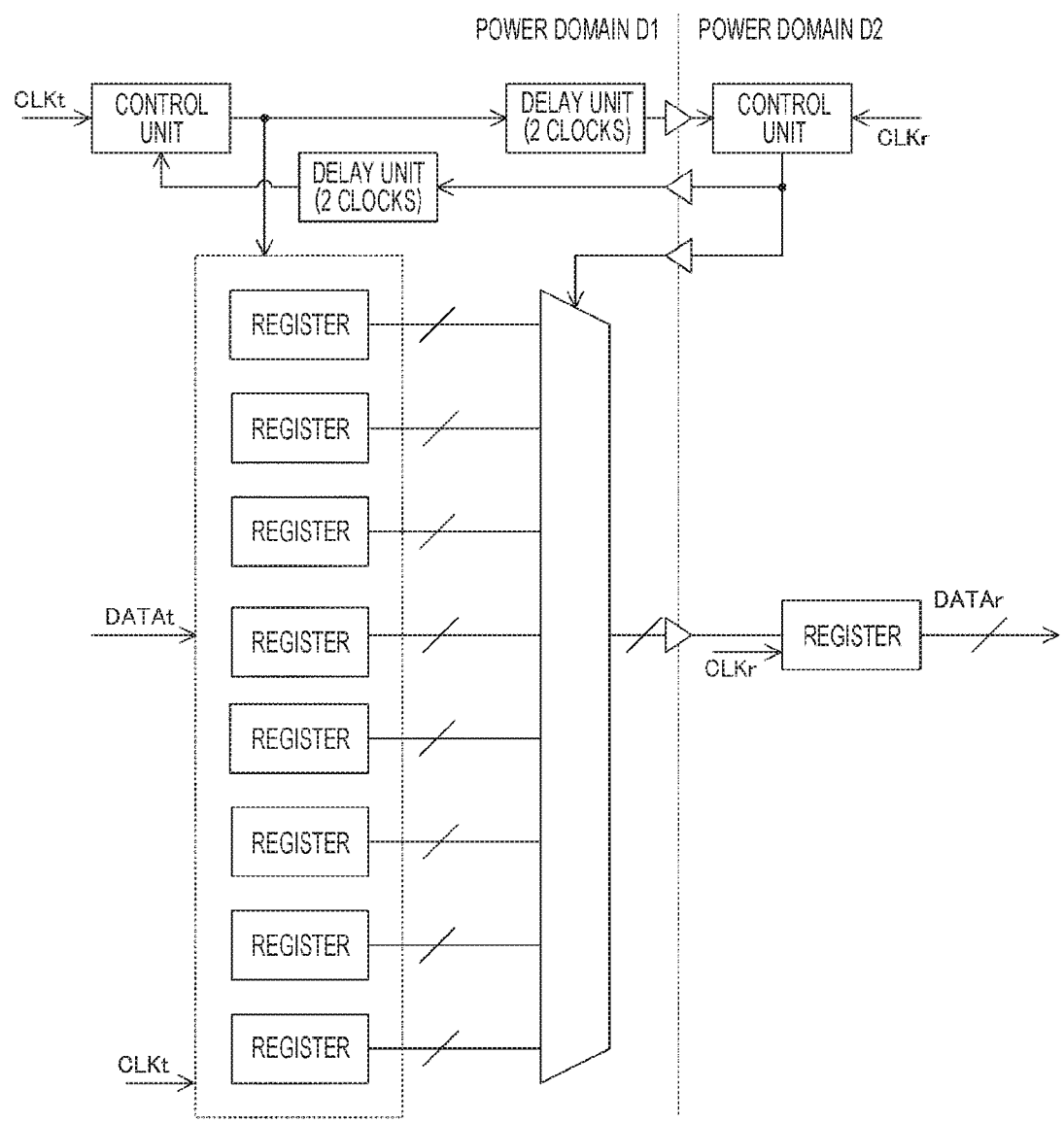
FIG. 18 is a circuit diagram illustrating a configuration example of the data transfer circuit of a comparative example in which level shifters are provided after the selector.

Here, as a method of reducing the number of level shifters, a method can be considered of arranging level shifters after the selector, as illustrated in FIG. 18. However, in this configuration, a control signal is transferred from the control unit on the reception side to the selector via a level shifter, and the data is also transferred from the selector to registers of the subsequent stage via the level shifters. That is, the control signal and the data are delayed by the level shifters. Due to influence of these delays, it becomes difficult to operate the selector and the registers in the subsequent stage in synchronization with the reception side clock signal CLKr generated on the power domain D2 side as illustrated in FIG. 2.

As described above, in the comparative example of FIG. 18, while the number of level shifters can be reduced, the timing design becomes difficult. Since the delay of the level shifter varies depending on a relationship between the voltages of the power domains, in a case where the voltage is variable, timing analysis is necessary on all the voltages to be used, and designing becomes more difficult. In addition, in the comparative example in FIG. 18, the number of wiring lines cannot be reduced between the selector and the registers.

On the other hand, in the data transfer circuit 200 illustrated in FIG. 9, as described above, the delay of the reception side with respect to the sending out timing of the transmission side is allowed up to two clocks. For this reason, the timing design becomes easier than the comparative example. Further, the level shifters 224 are arranged between the four registers 214 and the four registers 236. For this reason, when the 33-bit data is held in the registers 214, only 33×4 wiring lines are required, and the number of wiring lines can be reduced to half in comparison with the comparative example. The number of the level shifters 224 can be similarly reduced.

[Operation Example of Data Transfer Circuit]

Figure 19:
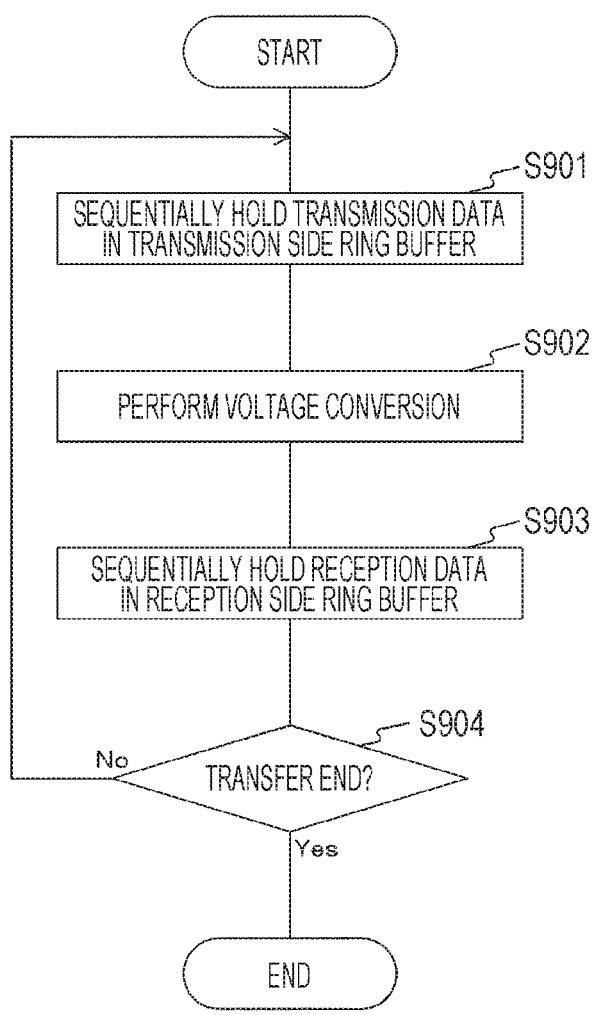
FIG. 19 is a flowchart illustrating an example of operation of the data transfer circuit in the first embodiment of the present technology.

FIG. 19 is a flowchart illustrating an example of operation of the data transfer circuit 200 in the first embodiment. This operation starts, for example, when the enable signal ENt at the high level is input to the data transfer circuit 200.

The data transfer circuit 200 sequentially holds the transmission data cyclically in the registers 214 in the transmission side ring buffer 210 (step S901). Then, the data transfer circuit 200 performs voltage conversion on the transmission data (step S902). The data transfer circuit 200 sequentially holds the received data subjected to the voltage conversion, cyclically in the registers 236 in the reception side ring buffer 230 (step S903).

The data transfer circuit 200 determines whether or not the enable signal ENt is at the low level (that is, an instruction of transfer end is given) (step S904). In a case where the instruction of transfer end is not given (step S904: No), the data transfer circuit 200 repeats the processing in step S901 and the subsequent steps. On the other hand, in a case where the instruction of transfer end is given (step S904: Yes), the data transfer circuit 200 ends the operation.

As described above, according to the first embodiment of the present technology, data is aligned and transferred synchronously between the transmission side ring buffer of the power domain D1 and the reception side ring buffer of the power domain D2, whereby the number of wiring lines can be reduced between the different power domains.

Second Embodiment

In the first embodiment described above, attention is focused only on transfer of data, but when image data is transmitted, it is also necessary to transmit a vertical synchronization signal. A semiconductor device 100 of a second embodiment is different from the first embodiment in that image data including a vertical synchronization signal is transferred.

Figure 20:
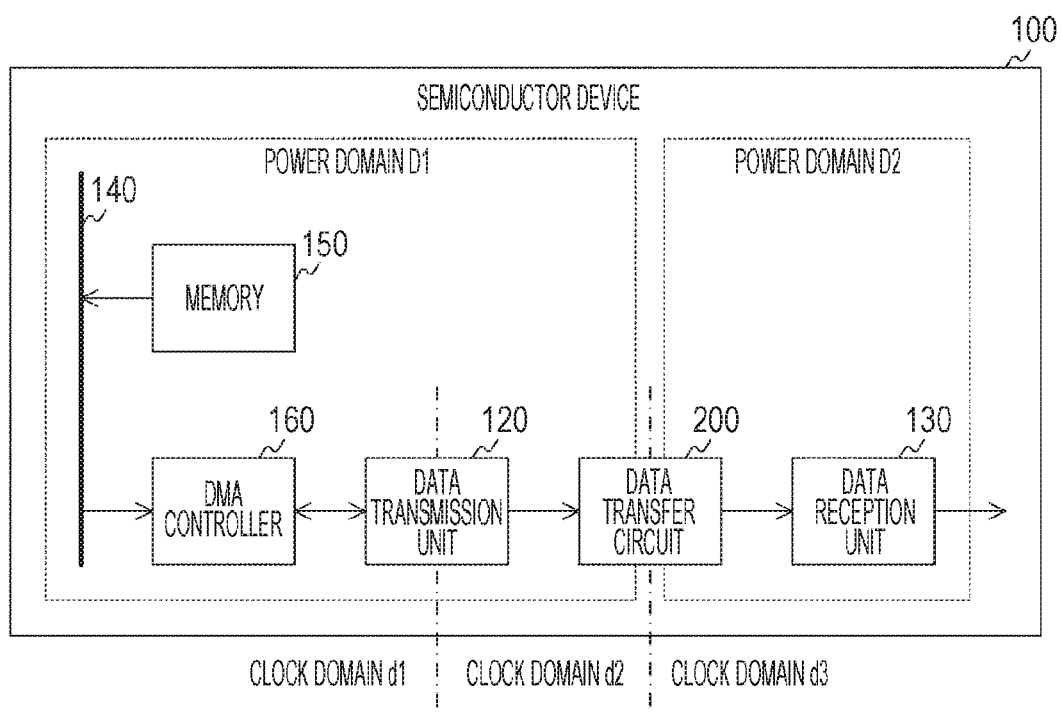
FIG. 20 is a block diagram illustrating a configuration example of a semiconductor device in a second embodiment of the present technology.

FIG. 20 is a block diagram illustrating a configuration example of the semiconductor device 100 in the second embodiment. The semiconductor device 100 of the second embodiment is different from the first embodiment in that a bus 140, a memory 150, and a direct memory access (DMA) controller 160 are further included in the power domain D1.

In addition, the semiconductor device 100 of the second embodiment is divided into clock domains d1, d2, and d3 to which clock signals different from each other are respectively supplied. In the clock domain d1, the bus 140, the memory 150, and the DMA controller 160 are arranged. At the boundary between the clock domains d1 and d2, the data transmission unit 120 is arranged. In addition, the data transfer circuit 200 is arranged at the boundary between the clock domains d2 and d3, and the data reception unit 130 is arranged in the clock domain d3. The clock signals of the respective clock domains d1, d2, and d3 are distributed by the clock signal distribution unit 110. In FIG. 20, the clock signal distribution unit 110 is omitted.

The bus 140 is a common path for the memory 150 and the DMA controller 160 to exchange data with each other.

The memory 150 holds data. For example, image data including a plurality of pixel data is held.

The DMA controller 160 transfers data between the memory 150 and the data transmission unit 120 without intervention of a central processing unit (CPU) or the like. Upon receiving a request signal for requesting transfer of data from the data transmission unit 120, the DMA controller 160 reads a plurality of pieces of data (pixel data and the like) from the memory 150 in accordance with the request signal, and sequentially transfers the data to the data transmission unit 120. However, upon receiving a wait signal from the data transmission unit 120, the DMA controller 160 waits to transfer the data until the buffer area in the data transmission unit 120 has a space.

Figure 21:
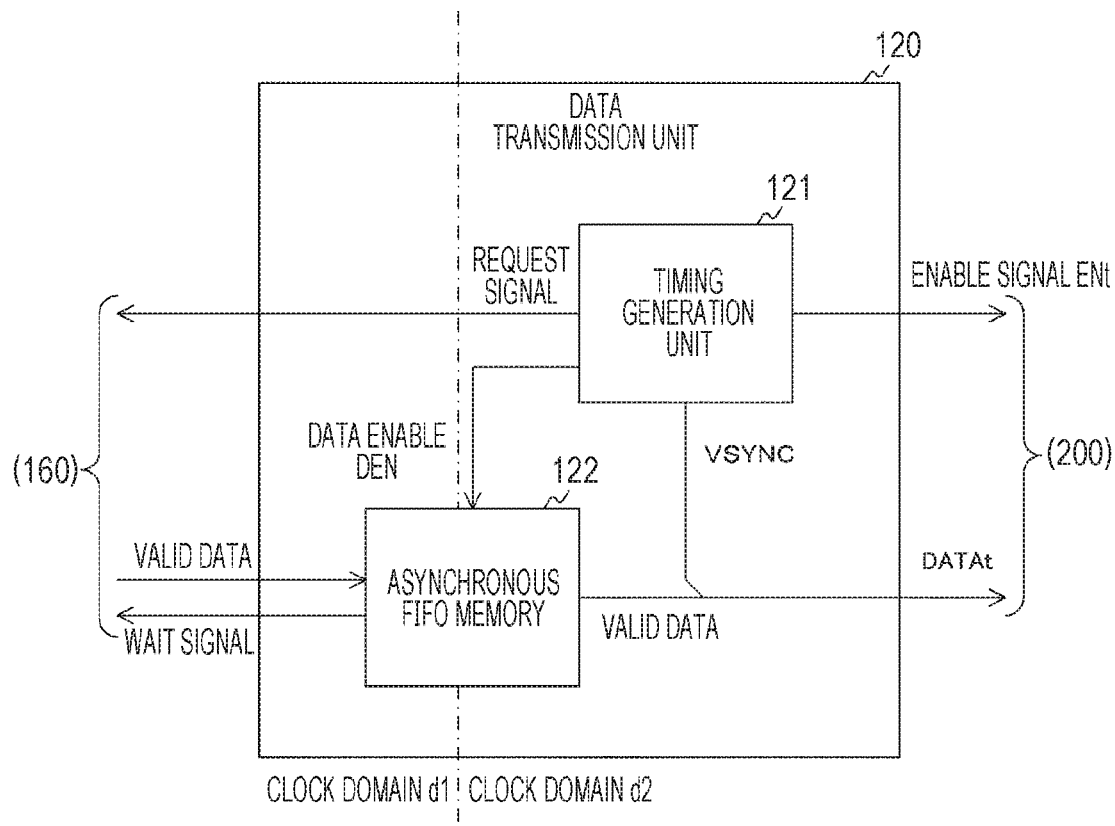
FIG. 21 is a block diagram illustrating a configuration example of a data transmission unit in the second embodiment of the present technology.

FIG. 21 is a block diagram illustrating a configuration example of the data transmission unit 120 in the second embodiment. The data transmission unit 120 includes a timing generation unit 121 and an asynchronous FIFO memory 122.

The timing generation unit 121 generates a timing signal such as a vertical synchronization signal VSYNC. The timing generation unit 121 operates in synchronization with the clock signal in the clock domain d2. At a predetermined timing at which transfer of image data is to be started, the timing generation unit 121 supplies a request signal to the DMA controller 160 and starts generating the vertical synchronization signal VSYNC. In addition, the timing generation unit 121 supplies the enable signal ENt at the high level to the data transfer circuit 200 and starts supplying the vertical synchronization signal VSYNC to the data transfer circuit 200.

The vertical synchronization signal VSYNC is controlled to the high level (valid) over a predetermined pulse period each time when a certain period elapses. In a period in which the vertical synchronization signal VSYNC is at the low level (invalid), the timing generation unit 121 supplies a data enable signal DEN indicating a period in which the data is valid to the asynchronous FIFO memory 122. For example, a periodic signal higher in frequency than the vertical synchronization signal VSYNC is supplied as the data enable signal DEN.

The asynchronous FIFO memory 122 holds data in a FIFO manner. The asynchronous FIFO memory 122 holds the data from the DMA controller 160 as valid data in the buffer area therein in synchronization with the clock signal in the clock domain d1. However, in a case where there is no space in the buffer area, the asynchronous FIFO memory 122 generates a wait signal and supplies the wait signal to the DMA controller 160.

In addition, the asynchronous FIFO memory 122 takes out valid data in a FIFO manner from the buffer area in synchronization with the data enable signal DEN and supplies the valid data to the data transfer circuit 200.

Figure 22:
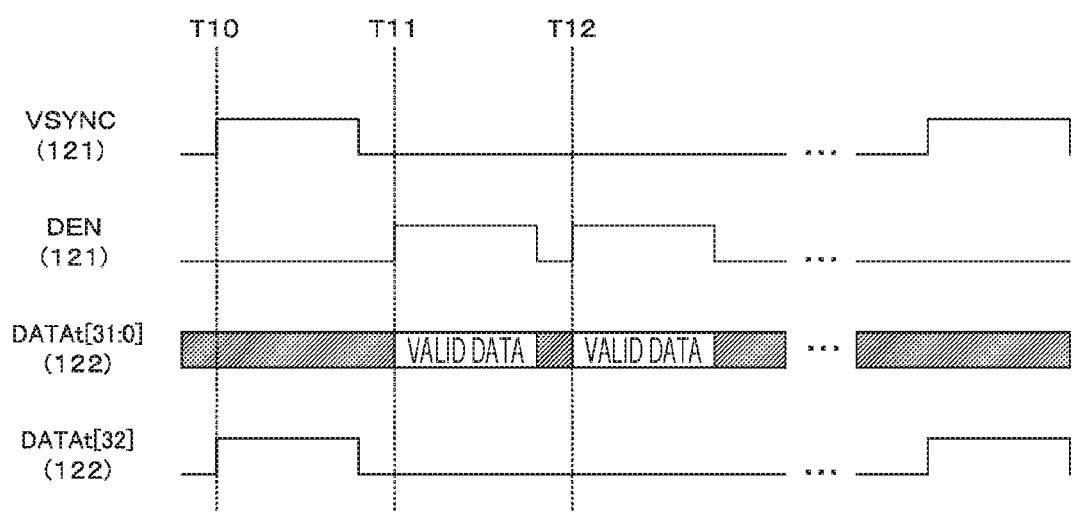
FIG. 22 is a timing chart illustrating an example of operation of the data transmission unit in the second embodiment of the present technology.

FIG. 22 is a timing chart illustrating an example of operation of the data transmission unit 120 in the second embodiment. The timing generation unit 121 sets the vertical synchronization signal VSYNC to the high level (valid) at a timing T10 or the like. In addition, the timing generation unit 121 generates the data enable signal DEN in a period in which the vertical synchronization signal VSYNC is at the low level (invalid).

The asynchronous FIFO memory 122 stores the vertical synchronization signal VSYNC at the 32nd bit (DATAt[32]) of the transmission data at a timing T11 or the like and outputs the signal. In addition, the asynchronous FIFO memory 122 stores valid data in 0th to 31st bits (DATAt[31:0]) of the transmission data in synchronization with the data enable signal DEN at a timing T12 or the like and outputs the valid data. As described above, image data is transferred including the vertical synchronization signal VSYNC and the valid data.

Figure 23:
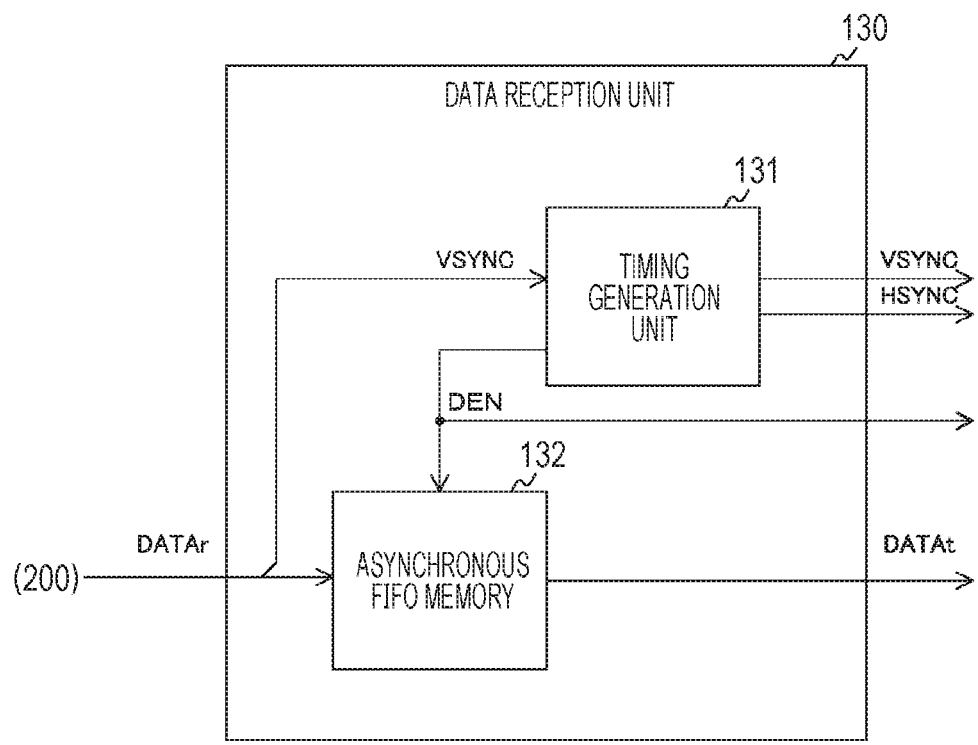
FIG. 23 is a block diagram illustrating a configuration example of a data reception unit in the second embodiment of the present technology.

FIG. 23 is a block diagram illustrating a configuration example of the data reception unit 130 in the second embodiment. The data reception unit 130 includes a timing generation unit 131 and an asynchronous FIFO memory 132.

The timing generation unit 131 generates timing signals such as a vertical synchronization signal VSYNC and a horizontal synchronization signal HSYNC. Upon receiving a vertical synchronization signal VSYNC from the data transfer circuit 200, the timing generation unit 131 generates the horizontal synchronization signal HSYNC higher in frequency than the vertical synchronization signal VSYNC, and a data enable signal DEN. The vertical synchronization signal VSYNC is taken out from the 32nd bit of the received data DATAr.

Then, the timing generation unit 131 outputs the vertical synchronization signal VSYNC to an external display device such as a monitor, and outputs the horizontal synchronization signal HSYNC to the display device within a period in which the vertical synchronization signal VSYNC is invalid. In addition, the timing generation unit 131 outputs the data enable signal DEN to the asynchronous FIFO memory 132 and the display device within the period in which the vertical synchronization signal VSYNC is invalid. The configuration of the asynchronous FIFO memory 132 is similar to that of the asynchronous FIFO memory 122 on the transmission side.

Figure 24:
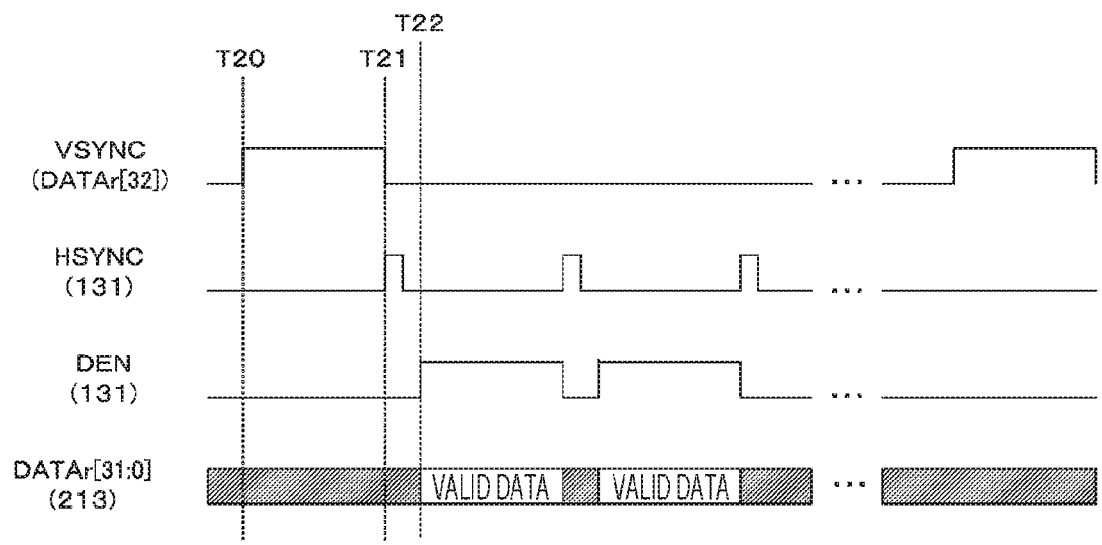
FIG. 24 is a timing chart illustrating an example of operation of the data reception unit in the second embodiment of the present technology.

FIG. 24 is a timing chart illustrating an example of operation of the data reception unit 130 in the second embodiment. The vertical synchronization signal VSYNC taken out from the 32nd bit (DATAr[32]) of the received data DATAr becomes at the high level (valid) at a timing T20 or the like. In addition, the timing generation unit 131 generates the horizontal synchronization signal HSYNC at a timing T21 or the like within a period in which the vertical synchronization signal VSYNC is at the low level (invalid). In addition, the timing generation unit 131 generates the data enable signal DEN at a timing T22 or the like within the period in which the vertical synchronization signal VSYNC is at the low level.

The asynchronous FIFO memory 132 outputs valid data stored in 0th to 31st bits (DATAr[31:0]) of the received data DATAr in synchronization with the data enable signal DEN. As described above, the image data is transferred to the display device.

As described above, according to the second embodiment of the present technology, since the data transmission unit 120 generates the vertical synchronization signal VSYNC and supplies the signal to the data transfer circuit 200, the image data including the vertical synchronization signal can be transferred to the data transfer circuit 200.

[Modification]

In the second embodiment described above, the semiconductor device 100 outputs digital image data to the display device; however, in a case where the interface standard of the display device supports only an analog signal, the image data cannot be displayed. A semiconductor device 100 of a modification of the second embodiment is different from the second embodiment in that an image is output as analog output.

Figure 25:
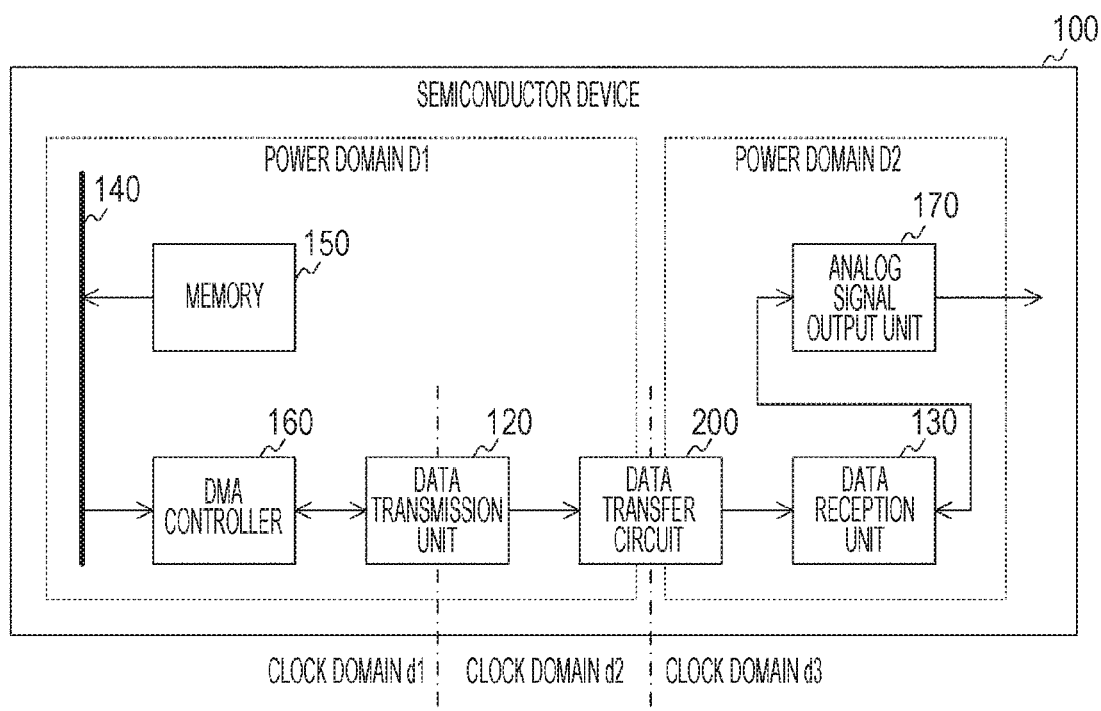
FIG. 25 is a block diagram illustrating a configuration example of a semiconductor device in a modification of the second embodiment of the present technology.

FIG. 25 is a block diagram illustrating a configuration example of the semiconductor device 100 in the modification of the second embodiment. The semiconductor device 100 of the modification of the second embodiment is different from the second embodiment in that an analog signal output unit 170 is further included.

The analog signal output unit 170 converts image data from the data reception unit 130 into an analog signal and outputs the analog signal.

Figure 26:
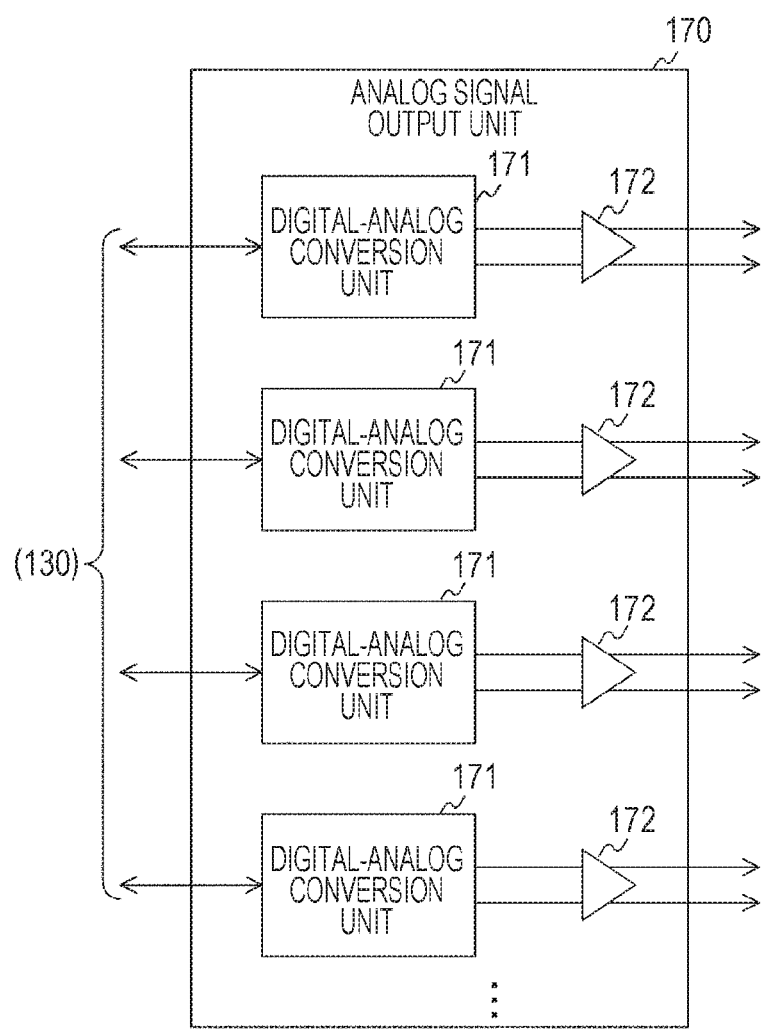
FIG. 26 is a block diagram illustrating a configuration example of an analog signal output unit in the modification of the second embodiment of the present technology.

FIG. 26 is a block diagram illustrating a configuration example of the analog signal output unit 170 in the modification of the second embodiment. The analog signal output unit 170 includes a plurality of digital-analog conversion units 171 and a plurality of differential amplifiers 172.

The digital-analog conversion units 171 convert data in image data into differential analog signals and output the differential analog signals to the differential amplifiers 172. Data to be converted include the vertical synchronization signal VSYNC, the horizontal synchronization signal HSYNC, the data enable signal DEN, and the valid data.

The differential amplifiers 172 amplify the analog signals from the digital-analog conversion units 171 and differentially output the analog signals to the display device.

As described above, according to the modification of the second embodiment of the present technology, since the analog signal output unit 170 converts image data into an analog signal and outputs the analog signal to a display device, an image can be displayed on a display device adaptable to the analog signal.

Note that, the embodiment described above describes an example for embodying the present technology, and matters in the embodiment and matters specifying the invention in the claims have correspondence relationships. Similarly, the matters specifying the invention in the claims and the matters in the embodiment of the present technology denoted by the same names have correspondence relationships. However, the present technology is not limited to the embodiment, and can be embodied by subjecting the embodiment to various modifications without departing from the gist thereof.

Note that, the effect described here is not necessarily limited, and can be any effect described in the present disclosure.

Note that, the present technology can also be configured as described below.

(1) A data transfer circuit including:
a transmission side buffer that starts, at a start timing, processing of sequentially selecting a plurality of transmission side buffer areas and holding transmission data in the areas selected over a predetermined time;
a voltage conversion unit that performs voltage conversion on the transmission data held and outputs the transmission data as received data; and
a reception side buffer that starts, when a delay time less than the predetermined time has elapsed from the start timing, processing of sequentially selecting a plurality of reception side buffer areas and holding the received data in the areas selected over the predetermined time.

(2) The data transfer circuit according to (1), in which
the plurality of transmission side buffer areas is respectively associated with reception side buffer areas different from each other,
the voltage conversion unit includes a plurality of level shifters each provided with an input terminal and an output terminal,
the input terminal of each of the plurality of level shifters is connected to a corresponding one of the transmission side buffer areas different from each other, and the output terminal is connected to one of the reception side buffer areas respectively corresponding to the transmission side buffer areas connected, and
the plurality of level shifters each convert a voltage of the received data from the input terminal to output the voltage to the output terminal.

(3) The data transfer circuit according to (2), in which
the transmission side buffer includes:
the plurality of transmission side buffer areas; and
a transmission control unit that starts, at the start timing, the processing of sequentially selecting the plurality of transmission side buffer areas and holding the transmission data in the areas selected over the predetermined time, as transmission side buffering processing.

(4) The data transfer circuit according to (3), in which
the reception side buffer includes:
the plurality of reception side buffer areas, and
a transmission control unit that starts, when the delay time has elapsed from the start timing, the processing of sequentially selecting the plurality of reception side buffer areas and holding the received data in the areas selected over the predetermined time, as reception side buffering processing.

(5) The data transfer circuit according to (4), in which
the transmission side buffer starts the transmission side buffering processing when an enable signal indicating the start timing is input,
the transmission side buffer starts the reception side buffering processing when the enable signal is input, and
the reception side buffer further includes a delay unit that delays the enable signal and supplies the enable signal delayed to the transmission side control unit.

(6) The data transfer circuit according to any of (1) to (5), further including
a selector that sequentially selects the plurality of reception side buffer areas and outputs the received data held in the areas selected.

(7) The data transfer circuit according to any of (1) to (6), in which
the transmission data includes a vertical synchronization signal and valid data.

(8) A data transfer system including:
a transmission side buffer that starts, at a start timing, processing of sequentially selecting a plurality of transmission side buffer areas and holding transmission data in the areas selected over a predetermined time;
a voltage conversion unit that performs voltage conversion on the transmission data held and outputs the transmission data as received data;
a reception side buffer that starts, when a delay time less than the predetermined time has elapsed from the start timing, processing of sequentially selecting a plurality of reception side buffer areas and holding the received data in the areas selected over the predetermined time; and
a data reception unit that processes the received data held.

(9) The data transfer system according to (8), further including
an analog signal output unit that converts the received data into an analog signal and outputs the analog signal.

(10) A method for controlling a data transfer circuit, the method including:
a transmission side procedure of starting, at a start timing, processing of sequentially selecting a plurality of transmission side buffer areas and holding transmission data in the areas selected over a predetermined time;
a voltage conversion procedure of performing voltage conversion on the transmission data held and outputs the transmission data as received data; and a reception side procedure of starting, when a delay time less than the predetermined time has elapsed from the start timing, processing of sequentially selecting a plurality of reception side buffer areas and holding the received data in the areas selected over the predetermined time.

REFERENCE SIGNS LIST

100 Semiconductor device
110 Clock distribution unit
111 Clock tree
112, 113, 221, 224 Level shifter
120 Data transmission unit
121, 131 Timing generation unit
122, 132 Asynchronous FIFO memory
130 Data reception unit
140 Bus
150 Memory
160 DMA controller
170 Analog signal output unit
171 Digital-analog conversion unit
172 Differential amplifier
200 Data transfer circuit
210 Transmission side ring buffer
211 Transmission control unit
212, 232, 233 Flip-flop
213, 234 One-hot state counter
214, 235, 236 Register
220 Voltage conversion unit
222, 223, 225, 226 Level shift buffer
230 Reception side ring buffer
231 Reception side control unit
240 Selector

The invention claimed is:

1. A data transfer circuit comprising:
a transmission side buffer that starts, at a start timing, processing of sequentially selecting a plurality of transmission side buffer areas and holding transmission data in the areas selected over a predetermined time;
a voltage converter that performs voltage conversion on the transmission data held and outputs the transmission data as received data;
a reception side buffer that starts, when a delay time less than the predetermined time has elapsed from the start timing, processing of sequentially selecting a plurality of reception side buffer areas and holding the received data in the areas selected over the predetermined time; and
a transmission side controller that starts, at the start timing, the processing of sequentially selecting the plurality of transmission side buffer areas and holding the transmission data in the areas selected over the predetermined time, as transmission side buffering processing, wherein
the transmission side buffer starts the transmission side buffering processing when an enable signal indicating the start timing is input,
the transmission side buffer starts a reception side buffering processing when the enable signal is input, and
the reception side buffer further includes a delay circuit that delays the enable signal and supplies the enable signal delayed to the transmission side controller.

2. The data transfer circuit according to claim 1, wherein the plurality of transmission side buffer areas is respectively associated with reception side buffer areas different from each other, the voltage converter includes a plurality of level shifters each provided with an input terminal and an output terminal,
the input terminal of each of the plurality of level shifters is connected to a corresponding one of the transmission side buffer areas different from each other, and the output terminal is connected to one of the reception side buffer areas respectively corresponding to the transmission side buffer areas connected, and
the plurality of level shifters each convert a voltage of the received data from the input terminal to output the voltage to the output terminal.

3. The data transfer circuit according to claim 2, wherein the transmission side buffer includes the plurality of transmission side buffer areas.

4. The data transfer circuit according to claim 1, wherein the reception side buffer includes:
the plurality of reception side buffer areas, and
a reception side controller that starts, when the delay time has elapsed from the start timing, the processing of sequentially selecting the plurality of reception side buffer areas and holding the received data in the areas selected over the predetermined time, as the reception side buffering processing.

5. The data transfer circuit according to claim 1, further comprising
a selector that sequentially selects the plurality of reception side buffer areas and outputs the received data held in the areas selected.

6. The data transfer circuit according to claim 1, wherein the transmission data includes a vertical synchronization signal and valid data.

7. A data transfer system comprising:
a transmission side buffer that starts, at a start timing, processing of sequentially selecting a plurality of transmission side buffer areas and holding transmission data in the areas selected over a predetermined time;
a voltage converter that performs voltage conversion on the transmission data held and outputs the transmission data as received data;
a reception side buffer that starts, when a delay time less than the predetermined time has elapsed from the start timing, processing of sequentially selecting a plurality of reception side buffer areas and holding the received data in the areas selected over the predetermined time;
a data receiver that processes the received data held; and
a transmission side controller that starts, at the start timing, the processing of sequentially selecting the plurality of transmission side buffer areas and holding the transmission data in the areas selected over the predetermined time, as transmission side buffering processing, wherein
the transmission side buffer starts the transmission side buffering processing when an enable signal indicating the start timing is input,
the transmission side buffer starts a reception side buffering processing when the enable signal is input, and
the reception side buffer further includes a delay circuit that delays the enable signal and supplies the enable signal delayed to the transmission side controller.

8. The data transfer system according to claim 7, further comprising
an analog signal output that converts the received data into an analog signal and outputs the analog signal.

9. The data transfer system according to claim 7, wherein
the plurality of transmission side buffer areas is respectively associated with reception side buffer areas different from each other,
the voltage converter includes a plurality of level shifters each provided with an input terminal and an output terminal,
the input terminal of each of the plurality of level shifters is connected to a corresponding one of the transmission side buffer areas different from each other, and the output terminal is connected to one of the reception side buffer areas respectively corresponding to the transmission side buffer areas connected, and
the plurality of level shifters each convert a voltage of the received data from the input terminal to output the voltage to the output terminal.

10. The data transfer system according to claim 9, wherein
the transmission side buffer includes the plurality of transmission side buffer areas.

11. The data transfer system according to claim 7, wherein
the reception side buffer includes:
the plurality of reception side buffer areas, and
a reception side controller that starts, when the delay time has elapsed from the start timing, the processing of sequentially selecting the plurality of reception side buffer areas and holding the received data in the areas selected over the predetermined time, as the reception side buffering processing.

12. The data transfer system according to claim 7, further comprising
a selector that sequentially selects the plurality of reception side buffer areas and outputs the received data held in the areas selected.

13. The data transfer system according to claim 7, wherein
the transmission data includes a vertical synchronization signal and valid data.

14. A method for controlling a data transfer circuit, the method comprising:
a transmission side procedure of starting, at a start timing, processing of sequentially selecting a plurality of transmission side buffer areas and holding transmission data in the areas selected over a predetermined time;
a voltage conversion procedure of performing voltage conversion on the transmission data held and outputs the transmission data as received data; and
a reception side procedure of starting, when a delay time less than the predetermined time has elapsed from the start timing, processing of sequentially selecting a plurality of reception side buffer areas and holding the received data in the areas selected over the predetermined time
a transmission control procedure that starts, at the start timing, the processing of sequentially selecting the plurality of transmission side buffer areas and holding the transmission data in the areas selected over the predetermined time, as transmission side buffering processing, wherein
the transmission side procedure starts the transmission side buffering processing when an enable signal indicating the start timing is input,
the transmission side procedure starts a reception side buffering processing when the enable signal is input, and
the reception side buffer further includes a delay unit that delays the enable signal and supplies the enable signal delayed for the transmission control procedure.

15. The method according to claim 14, wherein
the reception side buffer includes the plurality of reception side buffer areas, and
a reception side control procedure starts, when the delay time has elapsed from the start timing, the processing of sequentially selecting the plurality of reception side buffer areas and holding the received data in the areas selected over the predetermined time, as the reception side buffering processing.

16. The method according to claim 14, further comprising:
sequentially selecting the plurality of reception side buffer areas and outputting the received data held in the areas selected.

17. The method according to claim 14, wherein
the transmission data includes a vertical synchronization signal and valid data.

* * * * *